(12) United States Patent
Chou

(10) Patent No.: US 11,437,370 B2
(45) Date of Patent: Sep. 6, 2022

(54) SEMICONDUCTOR DEVICE WITH MULTIPLE THRESHOLD VOLTAGES AND METHOD FOR FABRICATING THE SAME

(71) Applicant: NANYA TECHNOLOGY CORPORATION, New Taipei (TW)

(72) Inventor: Yi-Hsien Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/143,663

(22) Filed: Jan. 7, 2021

(65) Prior Publication Data
US 2022/0216200 A1 Jul. 7, 2022

(51) Int. Cl.
| H01L 27/088 | (2006.01) |
| H01L 21/28 | (2006.01) |
| H01L 29/423 | (2006.01) |
| H01L 29/06 | (2006.01) |
| H01L 29/49 | (2006.01) |
| H01L 21/8234 | (2006.01) |
| H01L 21/762 | (2006.01) |

(52) U.S. Cl.
CPC ...... *H01L 27/088* (2013.01); *H01L 21/28088* (2013.01); *H01L 21/76229* (2013.01); *H01L 21/82345* (2013.01); *H01L 21/823456* (2013.01); *H01L 21/823481* (2013.01); *H01L 29/0649* (2013.01); *H01L 29/4236* (2013.01); *H01L 29/4966* (2013.01)

(58) Field of Classification Search
CPC ......... H01L 21/28088; H01L 21/76229; H01L 21/82345; H01L 21/823456; H01L 21/823481; H01L 27/088; H01L 29/0649; H01L 29/4236; H01L 29/4966
USPC ........................................................ 257/392
See application file for complete search history.

(56) References Cited

U.S. PATENT DOCUMENTS

| 10,249,538 B1 * | 4/2019 | Qi ........................ H01L 21/311 |
| 2020/0126977 A1 * | 4/2020 | Moriya ............... H01L 29/0696 |

* cited by examiner

*Primary Examiner* — Monica D Harrison
(74) *Attorney, Agent, or Firm* — Muncy, Geissler, Olds & Lowe, P.C.

(57) ABSTRACT

The present application discloses a semiconductor device with multiple threshold voltages and a method for fabricating the semiconductor device with the multiple threshold voltages. The semiconductor device includes a substrate, a first gate structure positioned in the substrate and having a first depth and a first threshold voltage, and a second gate structure positioned in the substrate and having a second depth and a second threshold voltage. The first depth is greater than the second depth, and the first threshold voltage is different from the second threshold voltage.

18 Claims, 29 Drawing Sheets

SEMICONDUCTOR DEVICE WITH MULTIPLE THRESHOLD VOLTAGES AND METHOD FOR FABRICATING THE SAME

TECHNICAL FIELD

The present disclosure relates to a semiconductor device and a method for fabricating the semiconductor device, and more particularly, to a semiconductor device with multiple threshold voltages and a method for fabricating the semiconductor device with the multiple threshold voltages.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first gate structure positioned in the substrate and having a first depth and a first threshold voltage, and a second gate structure positioned in the substrate and having a second depth and a second threshold voltage. The first depth is greater than the second depth, and the first threshold voltage is different from the second threshold voltage.

In some embodiments, the first gate structure includes a first gate dielectric layer inwardly positioned in the substrate and having the first depth, a first gate electrode layer conformally positioned on the first gate dielectric layer, and a first gate filler layer positioned on the first gate electrode layer, and the second gate structure includes a second gate dielectric layer inwardly positioned in the substrate and having the second depth, a second gate electrode layer conformally positioned on the second gate dielectric layer, and a second gate filler layer positioned on the second gate electrode layer.

In some embodiments, the first gate dielectric layer has a same thickness as that of the second gate dielectric layer.

In some embodiments, a top surface of first gate structure and a top surface of the second gate structure are substantially coplanar with a top surface of the substrate.

In some embodiments, the semiconductor device includes a first capping layer positioned on the first gate filler layer and on the substrate.

In some embodiments, the semiconductor device includes first isolation structures positioned in the substrate to define a first active area and a second isolation structure positioned opposite to one of the first isolation structures to define a second active area next to the first active area. The first gate structure is positioned in the first active area and the second gate structure is positioned in the second active area.

In some embodiments, the first isolation structures and the second isolation structure have different depths.

In some embodiments, the first isolation structures have a same depth as that of the second isolation structure.

In some embodiments, the semiconductor device includes a first wetting layer positioned between the first gate filler layer and the first gate electrode layer. The first wetting is formed of titanium, tantalum, nickel, or cobalt.

In some embodiments, the semiconductor device includes a first barrier layer positioned between the first wetting layer and the first gate filler layer. The first barrier layer is formed of titanium nitride, tantalum nitride, or a combination thereof.

In some embodiments, the first gate dielectric layer includes a first bottom dielectric layer inwardly positioned in the substrate and a first top dielectric layer positioned between the first bottom dielectric layer and the first gate electrode layer, the first bottom dielectric layer is formed of high-k dielectric materials, and the first top dielectric layer is formed of silicon oxide.

In some embodiments, bottom surfaces of the first impurity regions are at a same vertical level as bottom surfaces of the second impurity regions.

In some embodiments, a vertical level of bottom surfaces of the first impurity regions is lower than a vertical level of bottom surfaces of the second impurity regions.

In some embodiments, a top surface of first gate structure and a top surface of the second gate structure are at a vertical level lower than a vertical level of a top surface of the substrate, a first capping layer is positioned on the first gate structure, and a second capping layer is positioned on the second gate structure.

In some embodiments, the first capping layer includes a first bottom capping layer positioned on the first gate structure and a first top capping layer positioned on the first bottom capping layer, the first bottom capping layer is formed of high-k dielectric materials, and the first top capping layer is formed of silicon oxide.

In some embodiments, top surfaces of the first gate electrode layer and a top surface of the first gate filler layer are at a vertical level lower than a vertical level of top surfaces of the first gate dielectric layer, and a first capping layer is positioned on the first gate electrode layer and the first gate filler layer and contacts an inner surface of the first gate dielectric layer.

In some embodiments, the semiconductor device includes a first isolation structure and a second isolation structure positioned in the substrate to define a third active area. The first gate structure and the second gate structure positioned in the third active area.

In some embodiments, the semiconductor device includes third impurity regions positioned between the first isolation structure and the first gate structure, between the first gate structure and the second gate structure, and between the second gate structure and the second isolation structure.

Another aspect of the present disclosure provides a method for fabricating a semiconductor device including providing a substrate, forming a pre-trench in the substrate, concurrently deepening the pre-trench into a first trench and forming a second trench in the substrate, and concurrently forming a first gate structure in the first trench and a second gate structure in the second trench. The first gate structure has a first depth and a first threshold voltage, and the second gate structure has a second depth and a second threshold voltage. The first depth is greater than the second depth, and the first threshold voltage is different from the second threshold voltage.

In some embodiments, the step of concurrently forming the first gate structure in the first trench and the second gate structure in the second trench includes conformally forming an insulation material layer in the first trench and the second trench, conformally forming a work function material layer on the insulation material layer, forming a filler material layer on the work function material layer and to fill the first trench and the second trench, and performing a planarization process until a top surface of the substrate is exposed to turn the insulation material layer into a first gate dielectric layer in the first trench and a second gate dielectric layer in the second trench, to turn the work function material layer into a first gate electrode layer in the first trench and a second gate electrode layer in the second trench, and to turn the filler material layer into a first gate filler layer in the first trench and a second gate filler layer in the second trench. The insulation material layer is formed of high-k dielectric materials. The work function material layer is formed of polycrystalline silicon, aluminum, copper, titanium, tantalum, tungsten, molybdenum, tantalum nitride, nickel silicide, cobalt silicide, titanium nitride, tungsten nitride, titanium aluminide, titanium aluminum nitride, tantalum carbon nitride, tantalum carbides, tantalum silicon nitride, metal alloys, or a combination thereof. The filler material layer is formed of tungsten, aluminum, copper, titanium, silver, ruthenium, molybdenum, or alloys thereof. The first gate dielectric layer, the first gate electrode layer, and the first gate filler layer together configure the first gate structure, and the second gate dielectric layer, the second gate electrode layer, and the second gate filler layer together configure the second gate structure.

Due to the design of the semiconductor device of the present disclosure, the first gate structure and the second gate structure may have different depths so as to have different threshold voltages. Therefore, the first gate structure and the second gate structure may provide different functions. As a result, the applicability of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
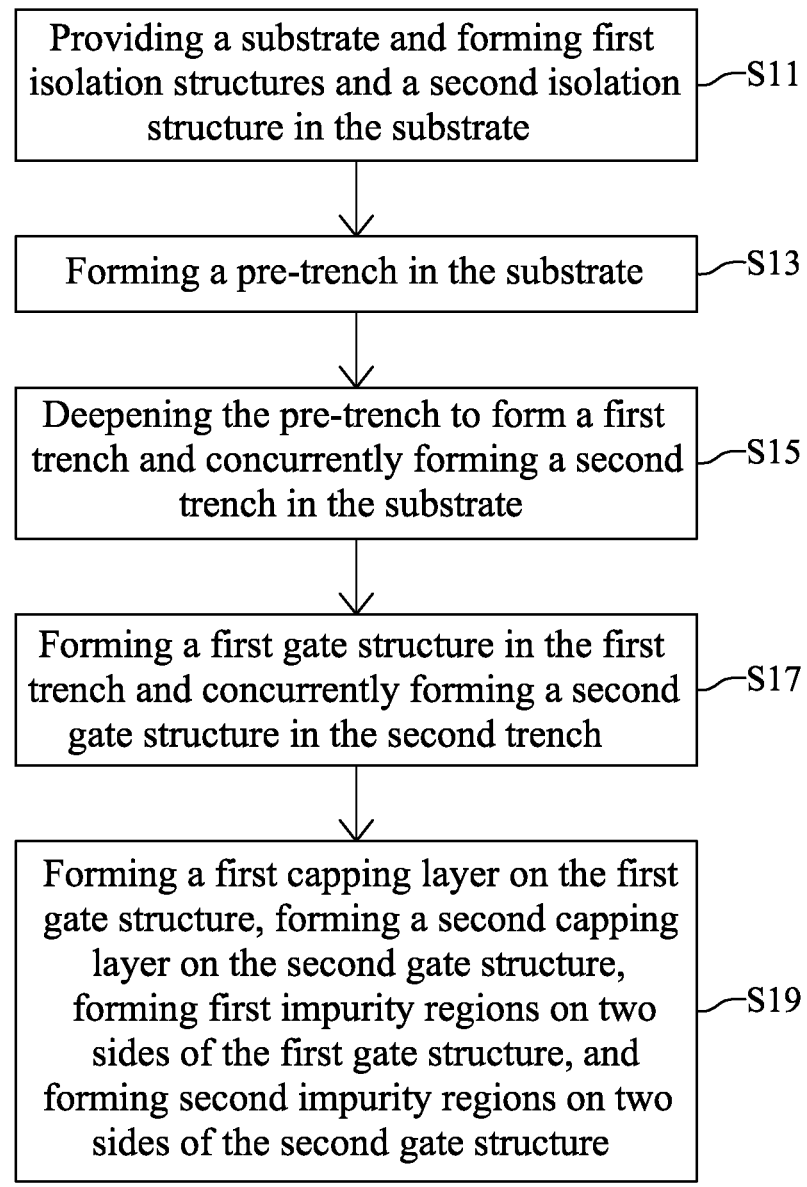
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

FIG. 1 illustrates, in a flowchart diagram form, a method 10 for fabricating a semiconductor device 1A in accordance with one embodiment of the present disclosure. FIGS. 2 to 12 illustrate, in schematic cross-sectional view diagrams, a flow for fabricating the semiconductor device 1A in accordance with one embodiment of the present disclosure.

With reference to FIGS. 1 to 5, at step S11, a substrate 101 may be provided and first isolation structures 200 and a second isolation structure 300 may be formed in the substrate 101.

Figure 2:
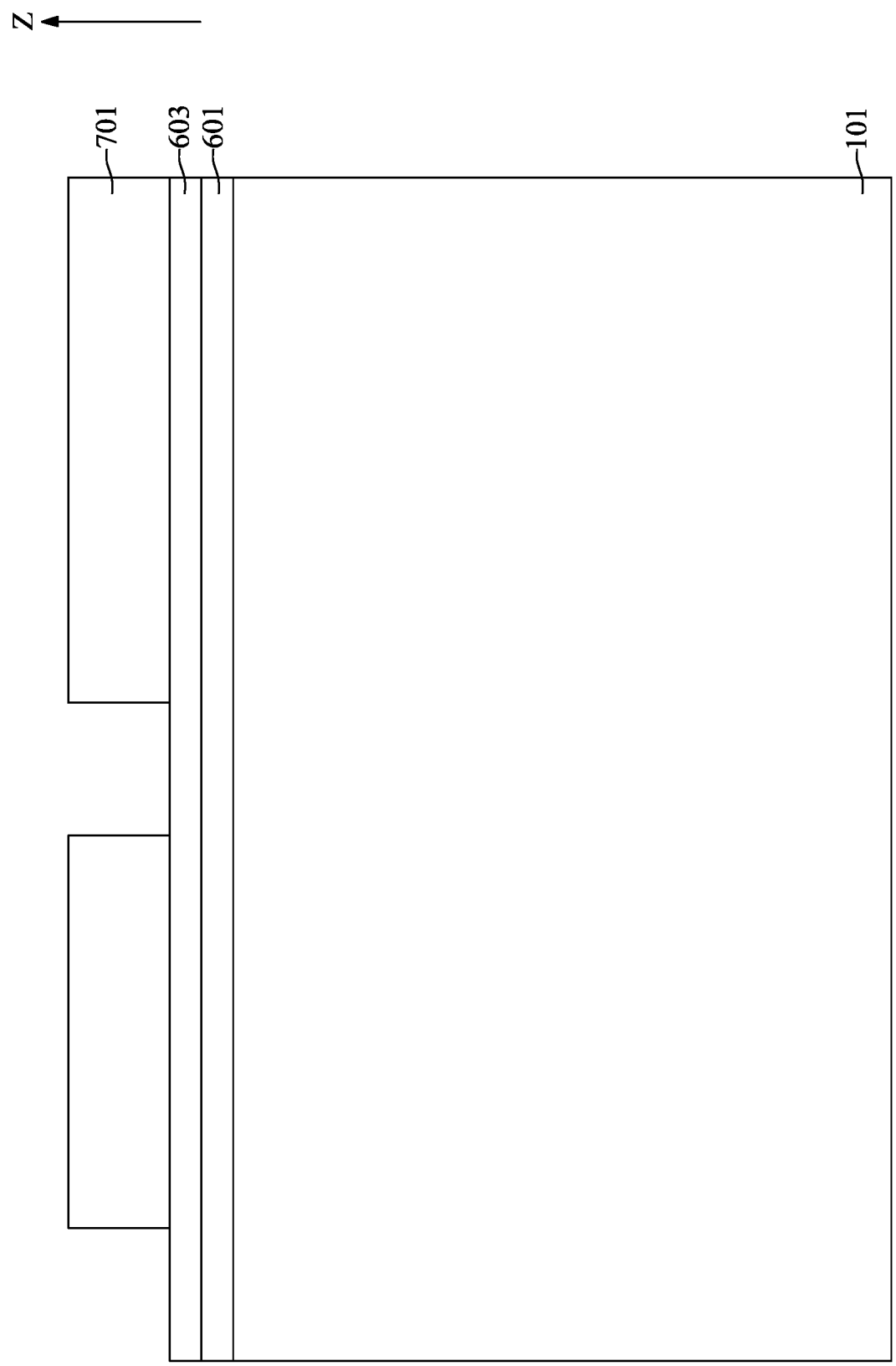
FIGS. 2 to 12 illustrate, in schematic cross-sectional view diagrams, a flow for fabricating the semiconductor device in accordance with one embodiment of the present disclosure.

With reference to FIG. 2, the substrate 101 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials. In some embodiments, the substrate 101 may include an organic semiconductor or a layered semiconductor such as silicon/silicon germanium, silicon-on-insulator, or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride, or any combination thereof.

With reference to FIG. 2, a series of deposition processes may be performed to deposit a pad oxide layer 601 and a pad nitride layer 603 on the substrate 101. The pad oxide layer 601 may be formed of, for example, silicon oxide or the like. The pad nitride layer 603 may be formed of, for example, silicon nitride or the like. A first mask layer 701 may be formed on the pad nitride layer 603. The first mask layer 701 may be a photoresist layer. A photolithography process may be performed to define a pattern of the first isolation structures 200 on the first mask layer 701.

Figure 3:
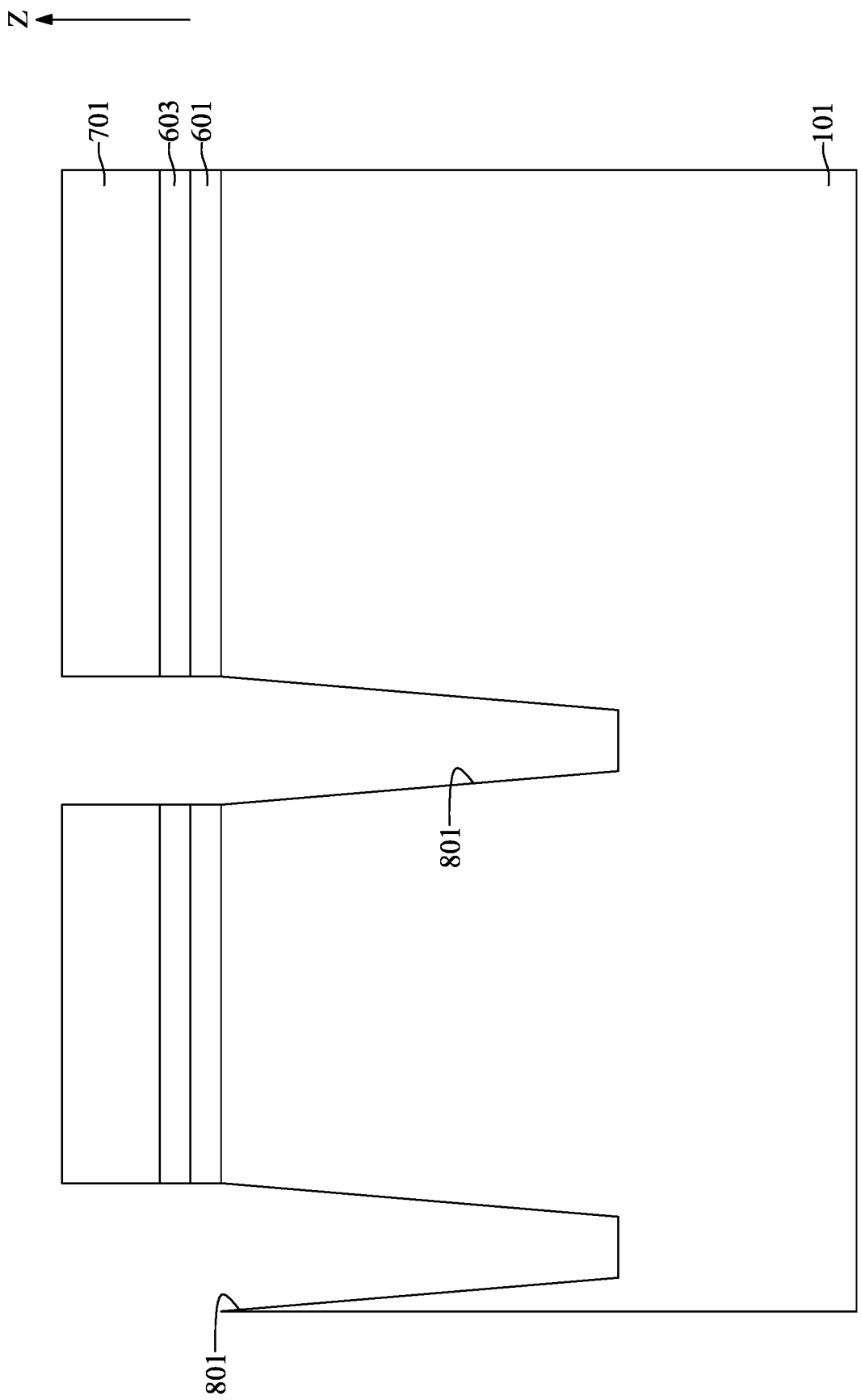

With reference to FIG. 3, after the photolithography process, an etch process, such as an anisotropic dry etch process, may be performed to form first isolation trenches 801 along the pad oxide layer 601 and the pad nitride layer 603 and extending to the substrate 101. In some embodiments, the etch process may include multiple steps, for example, a first etch step to transfer the pattern of the first isolation structures 200 to the pad nitride layer 603 and the pad oxide layer 601 and a following second etch step to remove portions of the substrate 101 to form the first isolation trenches 801. After the formation of the first isolation trench 801, the first mask layer 701 may be removed.

Figure 4:
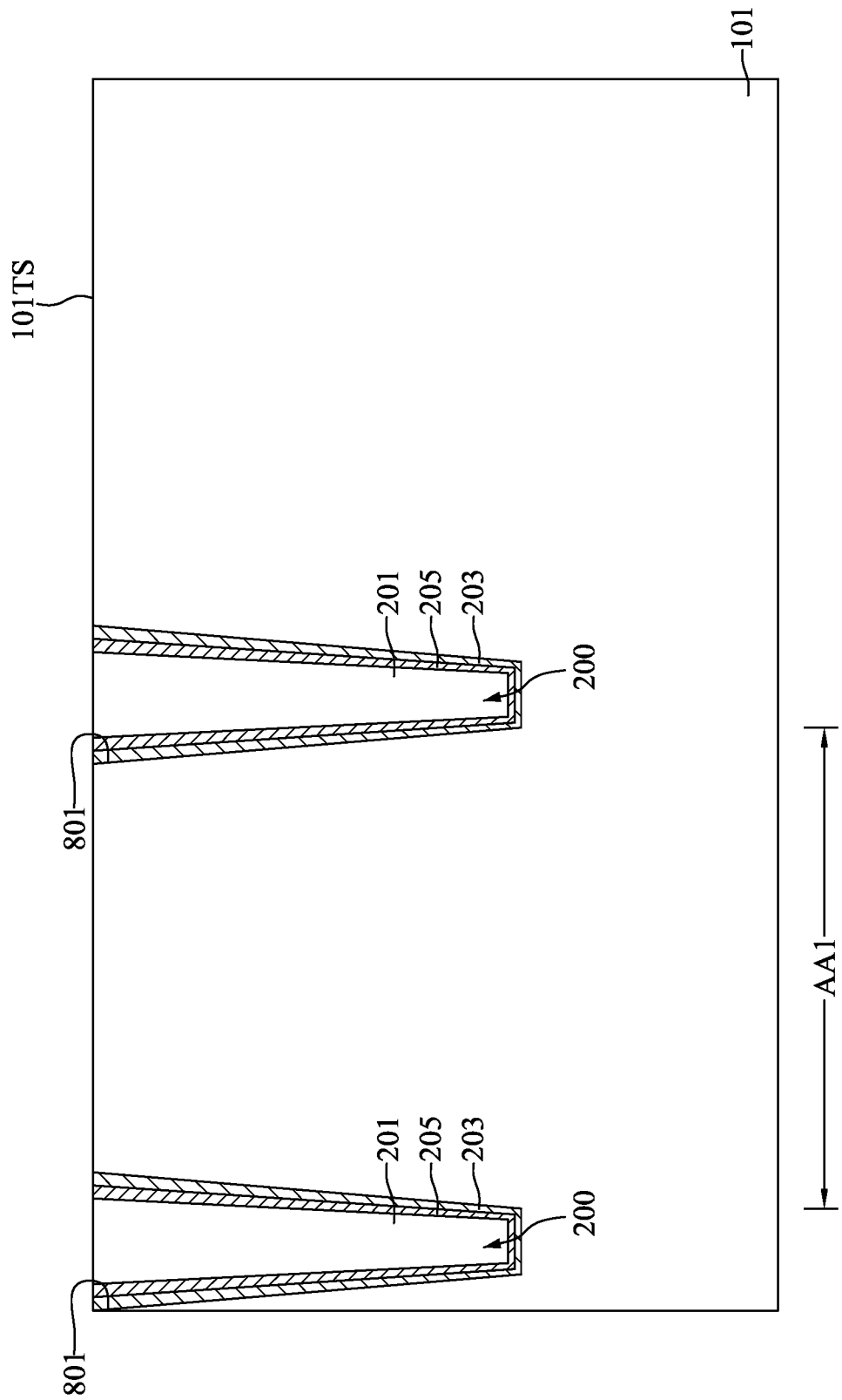

With reference to FIG. 4, a layer of adhesion material, which will turn into first adhesion layers 203 later, may be conformally formed in the first isolation trenches 801. In some embodiments, the adhesion material may be, for example, silicon oxide, silicon oxynitride, or silicon nitride oxide.

For example, the layer of adhesion material may be formed by performing a rapid thermal oxidation in an oxide/oxynitride atmosphere. A temperature of the rapid oxidation may be about 1000° C. The corners of the first isolation trench 801 may be rounded after the rapid thermal oxidation.

For another example, the layer of adhesion material may be formed by a deposition process that concurrently flows tetraethoxysilane (TEOS) and ozone to the first isolation trenches 801. The substrate temperature during the deposition process may be greater than 400° C., greater than 500° C., or greater than 600° C. Additives such as water (steam), hexamethyldisilazane (HMDS), and 1,1,3,3-tetramethyldisiloxane (TMDSO) may be added to ensure a more flowable or smooth deposition. Exemplary flow rate of TEOS may be greater than 0.1 gm/min (grams per minute), greater than 0.5 gm/min, greater than 1 gm/min, or greater than 3 gm/min. Exemplary flow rate of ozone may be flowed at greater than 1,000 sccm (standard cubic centimeters per minute), greater than 3,000 sccm, greater than 10,000 sccm, or greater than 30,000 sccm.

The layer of adhesion material may improve adhesion and reduce incidences of delamination and cracking during and after subsequent processing. In addition, the layer of adhesion material may exhibit a smoother outer surface which may positively affect the deposition dynamics in subsequent processing.

With reference to FIG. 4, a flowable layer, which will turn into first treated flowable layers 205 later, may be formed on the layer of adhesion material. In some embodiments, the flowable layer may include compounds having unsaturated bonding such as double bonds and triple bonds. The flowable layer may be characterized as a soft jelly-like layer, a gel having liquid flow characteristics, or a liquid layer but is not limited thereto. The flowable layer may flow into and fill small substrate gaps without forming voids or weak seams. In some embodiments, a thermal process may be performed to transform the flowable layer into a processed flowable layer by solidifying the flowable layer. The thermal process may break the unsaturated bonding into radicals, and the compounds may cross-link through the radicals. As a result, the flowable layer may be solidified. In some embodiments, the volume of the flowable layer may be reduced during the thermal process. Hence, the processed flowable layer may have greater density comparing to the flowable layer.

In some embodiments, the flowable layer may be flowable silicon oxide, silicon nitride, or silicon oxynitride. In some embodiments, the flowable layer may be silicon carbide or silicon oxycarbide.

With reference to FIG. 4, a high aspect ratio process may be performed to deposit a layer of isolation material, which will turn into first isolation layers 201 later, on the processed flowable layer, and the layer of isolation material may completely fill the first isolation trenches 801. The isolation material may be, for example, silicon oxide, silicon nitride, silicon oxynitride, silicon nitride oxide, or fluoride-doped silicate.

The high aspect ratio process may include a first stage and a second stage. The first stage may have a low deposition rate to ensure a more even trench fill with a reduced chance of forming voids. The second stage may have a rapid deposition rate to increase overall production efficiency by decreasing the deposition time. The high aspect ratio process may include both a slower deposition rate stage when the slower deposition rate is advantageous for reducing defects, and a higher deposition rate stage when the high deposition rate results in shorter deposition times.

In some embodiments, the pressure of the high aspect ratio process may be between about 200 Torr and about 760 Torr. In some embodiments, the temperature of the high aspect ratio process may be between about 400° C. and about 570° C.

In some embodiments, a two stage anneal may be performed to the layer of isolation material. The first stage of the two stage anneal may be proceeded at a lower temperature in an environment that includes one or more oxygen containing species such as water, oxygen, nitric oxide, or nitrous oxide. The first stage of the two stage anneal may rearrange and strengthen the silicon oxide network to prevent the formation of voids and opening of weak seams in the trenches. In addition, the lower temperature of the first stage of the two stage anneal may keep the oxygen from reacting with the trench walls and other portions of the substrate 101 to form undesirable oxide layers.

The second stage of the two stage anneal may be subsequently proceeded at the higher temperature in an environment that lacks oxygen. The second stage of the two stage anneal may rearrange the structure of the isolation material and drive out moisture, both of which increase the density of the isolation material. The environment may be, for example, substantially pure nitrogen, a mixture of nitrogen and noble gases (e.g., helium, neon, argon, or xenon), or a substantially pure noble gas. The environment may also include reducing gases such as hydrogen or ammonia. The second stage of the two stage anneal may facilitate the high-temperature densification without the oxidation of the substrate 101.

With reference to FIG. 4, a planarization process, such as chemical mechanical polishing, may be performed until the top surface 101TS of the substrate 101 is exposed. After the planarization process, the layer of adhesion material may be turned into the first adhesion layers 203 in the first isolation trenches 801. The processed flowable layer may be turned into the first treated flowable layers 205 in the first isolation trenches 801. The layer of isolation material may be turned in to the first isolation layers 201 in the first isolation trenches 801. The first isolation layers 201, the first adhesion layers 203, and the first treated flowable layers 205 together configure the first isolation structures 200.

With reference to FIG. 4, top surfaces of the first isolation structures 200 may be substantially coplanar with the top surface 101TS of the substrate 101. The first isolation structures 200 may define a first active area AA1 of the substrate 101. It should be noted that the first active area AA1 may comprise a portion of the substrate 101 and a space above the portion of the substrate 101. Describing an element as being disposed on the first active area AA1 means that the element is disposed on a top surface of the portion of the substrate 101. Describing an element as being disposed in the first active area AA1 means that the element is disposed in the portion of the substrate 101; however, a top surface of the element may be even with the top surface of the portion of the substrate 101. Describing an element as being disposed above the first active area AA1 means that the element is disposed above the top surface of the portion of the substrate 101.

Figure 5:
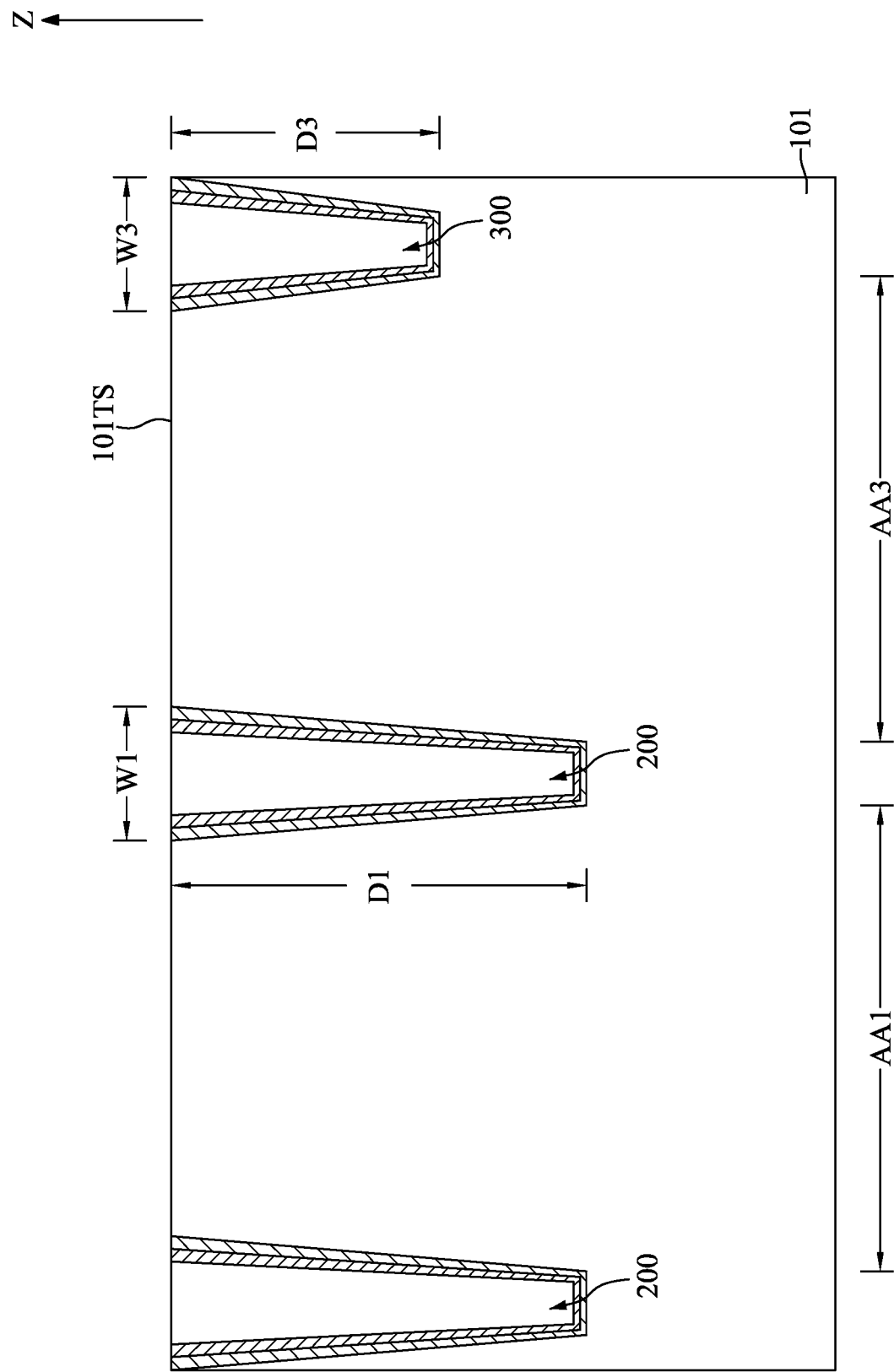

With reference to FIG. 5, the second isolation structure 300 may be formed in the substrate 101 with a procedure similar to the first isolation structures 200 illustrated in FIGS. 2 to 4. The second isolation structure 300 and one of the first isolation structures 200 may define a second active area AA3. The second active area AA3 may be next to the first active area AA1. The top surface of the second isolation structure 300, the top surfaces of the first isolation structures 200, and the top surface 101TS of the substrate 101 may be substantially coplanar. In some embodiments, the depth D1 of the first isolation structures 200 may be greater than the depth D3 of the second isolation structure 300. In some embodiments, the width W3 of the second isolation structure 300 may be the same as the width W1 of the first isolation structures 200. In some embodiments, the width W3 of the second isolation structure 300 may be greater than the width W1 of the first isolation structures 200.

Figure 6:
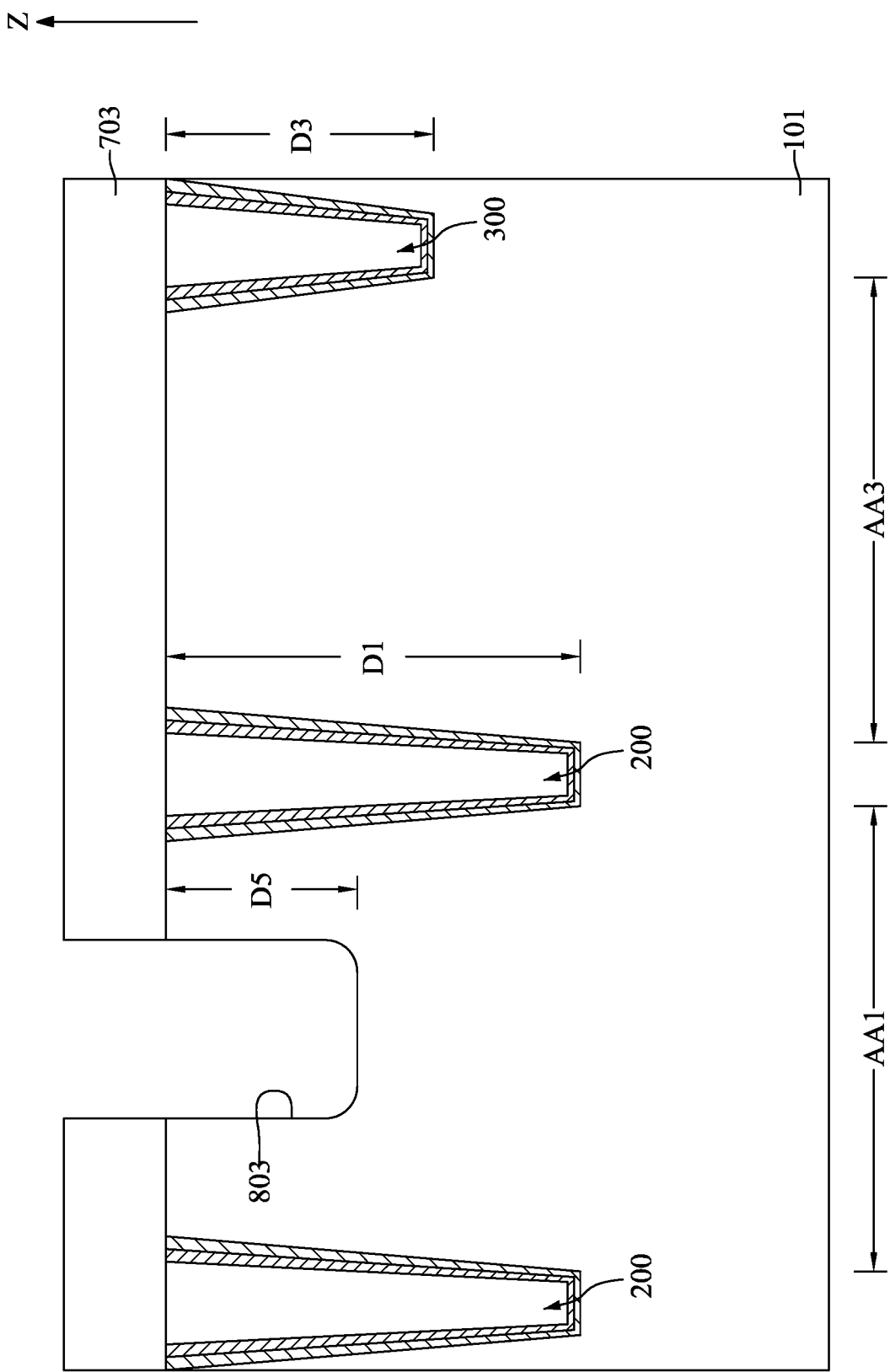

With reference to FIGS. 1 and 6, at step S13, a pre-trench 803 may be formed in the substrate 101.

With reference to FIG. 6, a second mask layer 703 may be formed on the substrate 101 and may cover the first isolation structures 200 and the second isolation structure 300. In some embodiments, the second mask layer 703 may be a photoresist layer. In some embodiments, the second mask layer 703 may be a multiple layered structure including a hard mask layer on the substrate 101 and a photoresist layer on the hard mask layer. The hard mask layer may be formed of, for example, silicon nitride or the like. A photolithography process may be performed to define a pattern of the pre-trench 803 on the second mask layer 703.

With reference to FIG. 6, a first etch process may be performed to remove a portion of the substrate 101 to form the pre-trench 803. In some embodiments, the first etch process may include multiple steps such as a first etch step to transfer the pattern of the pre-trench 803 from the photoresist layer onto the hard mask layer of the second mask layer 703 and a second etch step to remove a portion of the substrate 101 to form the pre-trench 803. The pre-trench 803 may be in the first active area AA1 and may have a depth D5. In some embodiments, the depth D5 of the pre-trench 803 may be less than the depth D3 of the second isolation structure 300. In some embodiments, the depth D5 of the pre-trench 803 may be the same as the depth D3 of the second isolation structure 300. In some embodiments, the depth D5 of the pre-trench 803 may be greater than the depth D3 of the second isolation structure 300. In some embodiments, after the formation of the pre-trench 803, the second isolation structure 300 may be removed.

Figure 7:
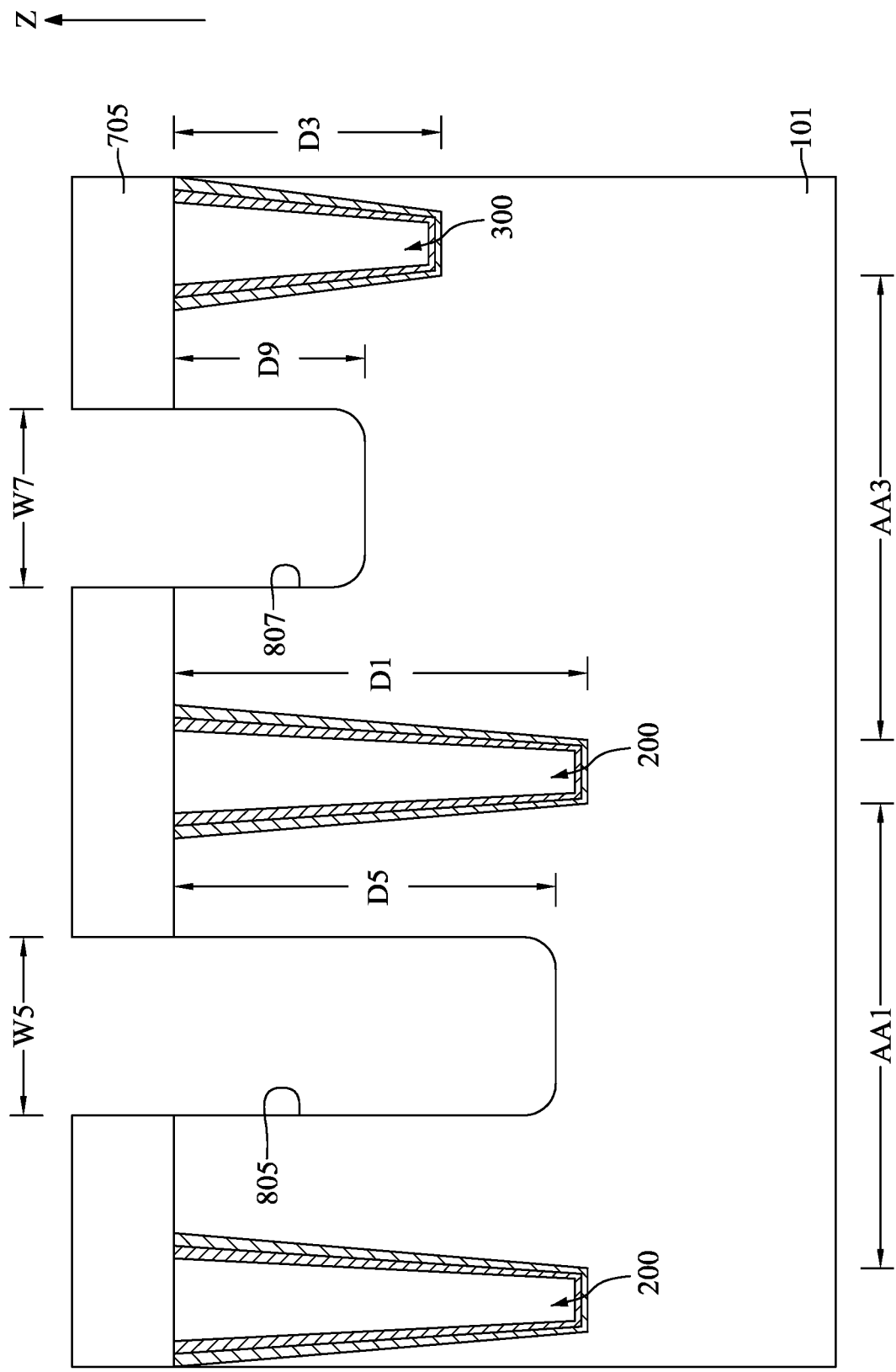

With reference to FIGS. 1 and 7, at step S17, the pre-trench 803 may be deepened to form a first trench 805 and a second trench 807 may be concurrently formed in the substrate 101.

With reference to FIG. 7, in some embodiments, a third mask layer 705 may be formed on the substrate 101. The third mask layer 705 may be a photoresist layer having a pattern of the first trench 805 and the second trench 807. Subsequently, a second etch process may be performed to deepen the pre-trench 803 into the first trench 805 and concurrently form the second trench 807.

In some embodiments, the third mask layer 705, which is a photoresist layer, may be formed on the hard mask layer of the second mask layer 703. A photolithography process may be performed to define a pattern of the second trench 807 on the third mask layer 705. A following pattern transfer etch may be performed to transfer the pattern of the second trench 807 onto the hard mask layer of the second mask layer 703. After the pattern transference, the third mask layer 705 may be removed. The second etch process may be subsequently performed to deepen the pre-trench 803 to form the first trench 805 and concurrently form the second trench 807.

With reference to FIG. 7, the first trench 805 may be formed in the first active area AA1 and have a depth D7. The second trench 807 may be formed in the second active area AA3 and have a depth D9. In some embodiments, the depth D7 of the first trench 805 may be less than the depth D1 of the first isolation structures 200 and may be greater than the depth D9 of the second trench 807. In some embodiments, the depth D9 of the second trench 807 may be less than the depth D3 of the second isolation structure 300. In some embodiments, the depth D9 of the second trench 807 may be greater than the depth D3 of the second isolation structure 300 and may be less than the depth D7 of the first trench 805. In some embodiments, the depth D7 of the first trench 805 may be greater than the depth D1 of the first isolation structures 200. In some embodiments, a width W5 of the first trench 805 may be the same as a width W7 of the second trench 807. In some embodiments, the width W5 of the first trench 805 may be less than the width W7 of the second trench 807.

It should be noted that "concurrently formed" (or similar language) as used herein refers to form in a same fabrication step, at approximately (but not necessarily exactly) the same time.

With reference to FIG. 1 and FIGS. 8 to 11, at step S17, a first gate structure 400 may be formed in the first trench 805 and a second gate structure 500 may be concurrently formed in the second trench 807.

Figure 8:
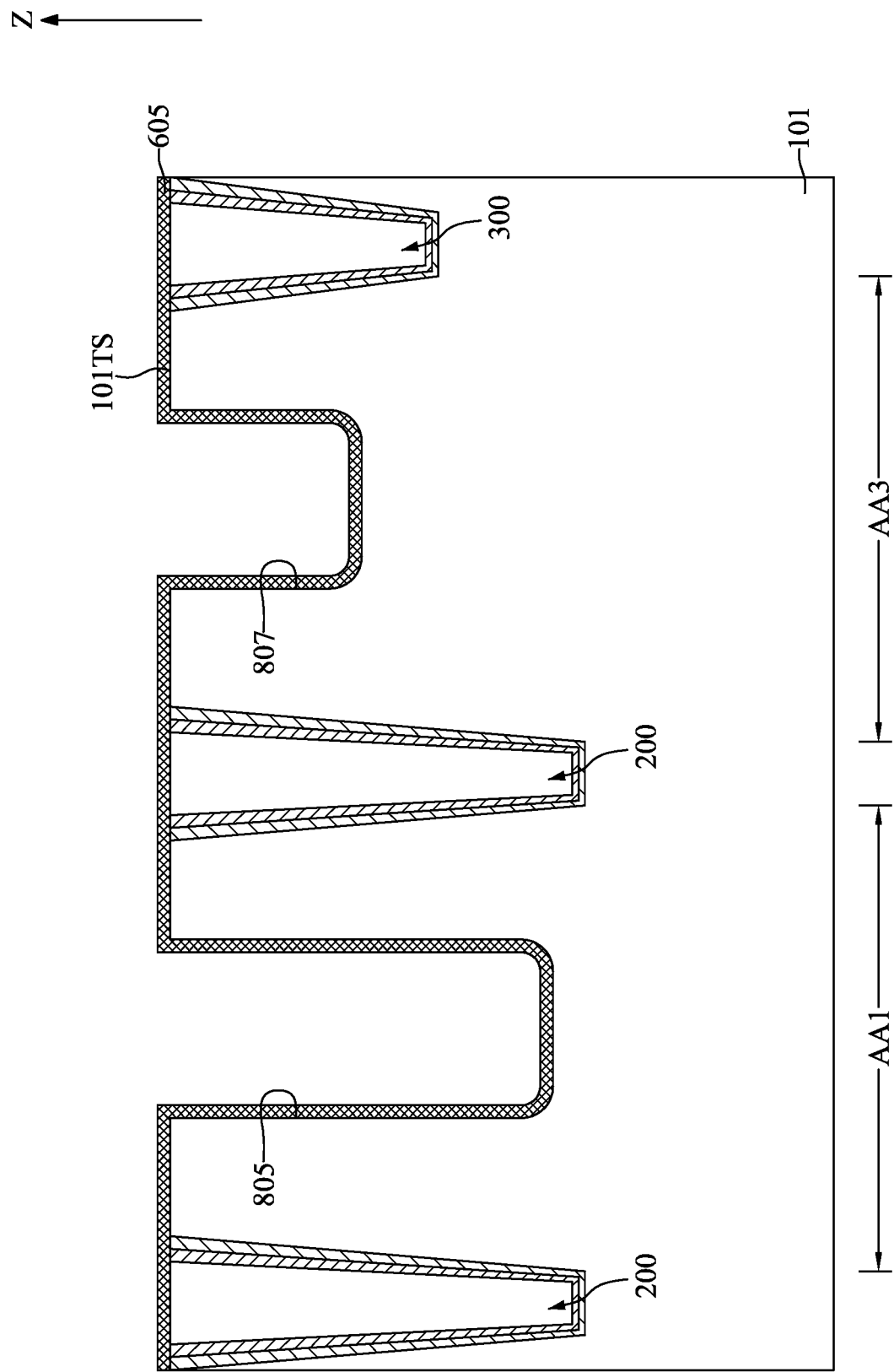

With reference to FIG. 8, an insulation material layer 605 may be conformally formed in the first trench 805 and the second trench 807 and on the top surface 101TS of the substrate 101. The insulation material layer 605 in the first trench 805 and the second trench 807 may have U-shaped cross-sectional profiles. The insulation material layer 605 may include, for example, oxides, nitrides, oxynitrides, silicates (e.g., metal silicates), aluminates, titanates, nitrides, high-k dielectric materials, or a combination thereof. The insulation material layer 605 may be formed by suitable deposition processes, for example, chemical vapor deposition, plasma-enhanced chemical vapor deposition, atomic layer deposition, evaporation, chemical solution deposition, or other suitable deposition processes. The thickness of the insulation material layer 605 may vary depending on the deposition process as well as the composition and number of materials used. In some embodiments, the insulation material layer 605 includes multiple layers. For example, the insulation material layer 605 may be an oxide-nitride-oxide (ONO) structure. For another example, the insulation material layer 605 may include a bottom layer formed of silicon oxide and a top layer formed of high-k dielectric materials.

Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

In some embodiments, an interfacial layer (not shown) may be formed between the substrate 101 and the insulation material layer 605. The interfacial layer may include be formed of, for example, silicon oxide, silicon nitride, silicon oxynitride, other semiconductor oxides, or a combination thereof. The interfacial layer may be formed to any suitable thickness using any suitable process including thermal growth, atomic layer deposition, chemical vapor deposition, high-density plasma chemical vapor deposition, spin-on deposition, or other suitable deposition processes. For example, the thickness of the interfacial layer may be between about 7 angstroms and 12 angstroms or between about 8 angstroms and 10 angstroms. The interfacial layer may facilitate the formation of the insulation material layer 605 during fabrication of the semiconductor device 1A.

Figure 9:
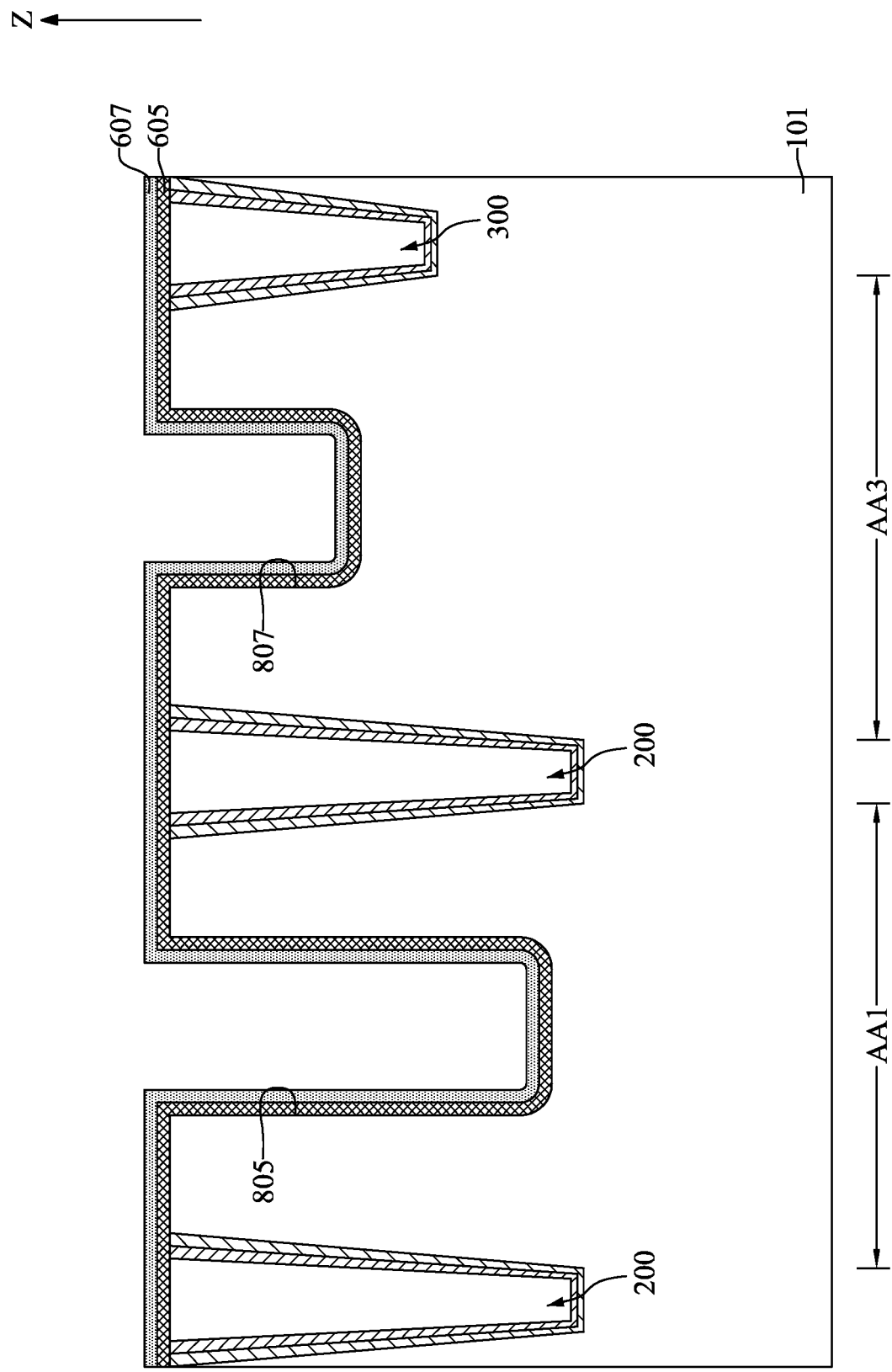

With reference to FIG. 9, a work function material layer 607 may be conformally formed on the insulation material layer 605. In some embodiments, the work function material layer 607 may include polycrystalline silicon, aluminum, copper, titanium, tantalum, tungsten, molybdenum, tantalum nitride, nickel silicide, cobalt silicide, titanium nitride, tungsten nitride, titanium aluminide, titanium aluminum nitride, tantalum carbon nitride, tantalum carbides, tantalum silicon nitride, metal alloys, or a combination thereof. In some embodiments, the work function material layer 607 may be formed of, for example, p-type work function metal materials and n-type work function metal materials. P-type work function materials may include compositions such as ruthenium, palladium, platinum, cobalt, nickel, and conductive metal oxides, titanium nitride, or a combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function material layer 607 may be formed by a suitable deposition process, for example, a conformal atomic layer deposition.

The conformal atomic layer deposition alternately supplies two (or more) different source gases one by one onto a process object under predetermined process conditions, so that chemical species is adsorbed to the process object at a single atomic layer level, and are deposited on the process object through surface reactions. For instance, first and second source gases are alternately supplied to a process object to flow along the surface thereof, thereby molecules contained in the first source gas adsorb to the surface, and molecules contained in the second source gas react with the adsorbed molecules originated from the first source gas to form a film of a thickness of a single molecule level.

Figure 10:
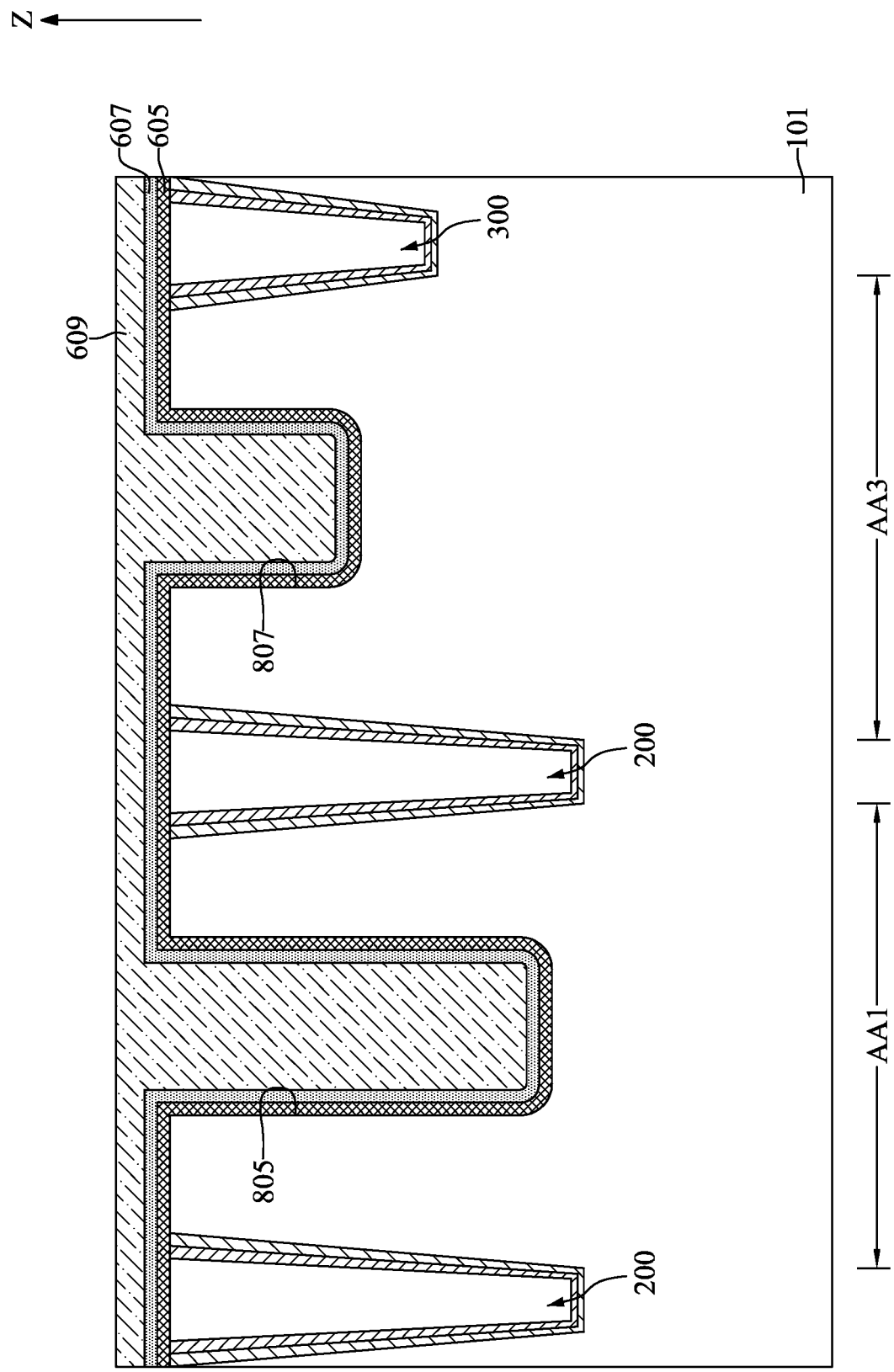

With reference to FIG. 10, a filler material layer 609 may be formed on the work function material layer 607 and may fill the first trench 805 and the second trench 807. The filler material layer 609 may include any suitable conductor including tungsten, aluminum, copper, titanium, silver, ruthenium, molybdenum, or alloys thereof. The filler material layer 609 may be formed by, for example, atomic layer deposition, chemical vapor deposition, or sputtering.

Figure 11:
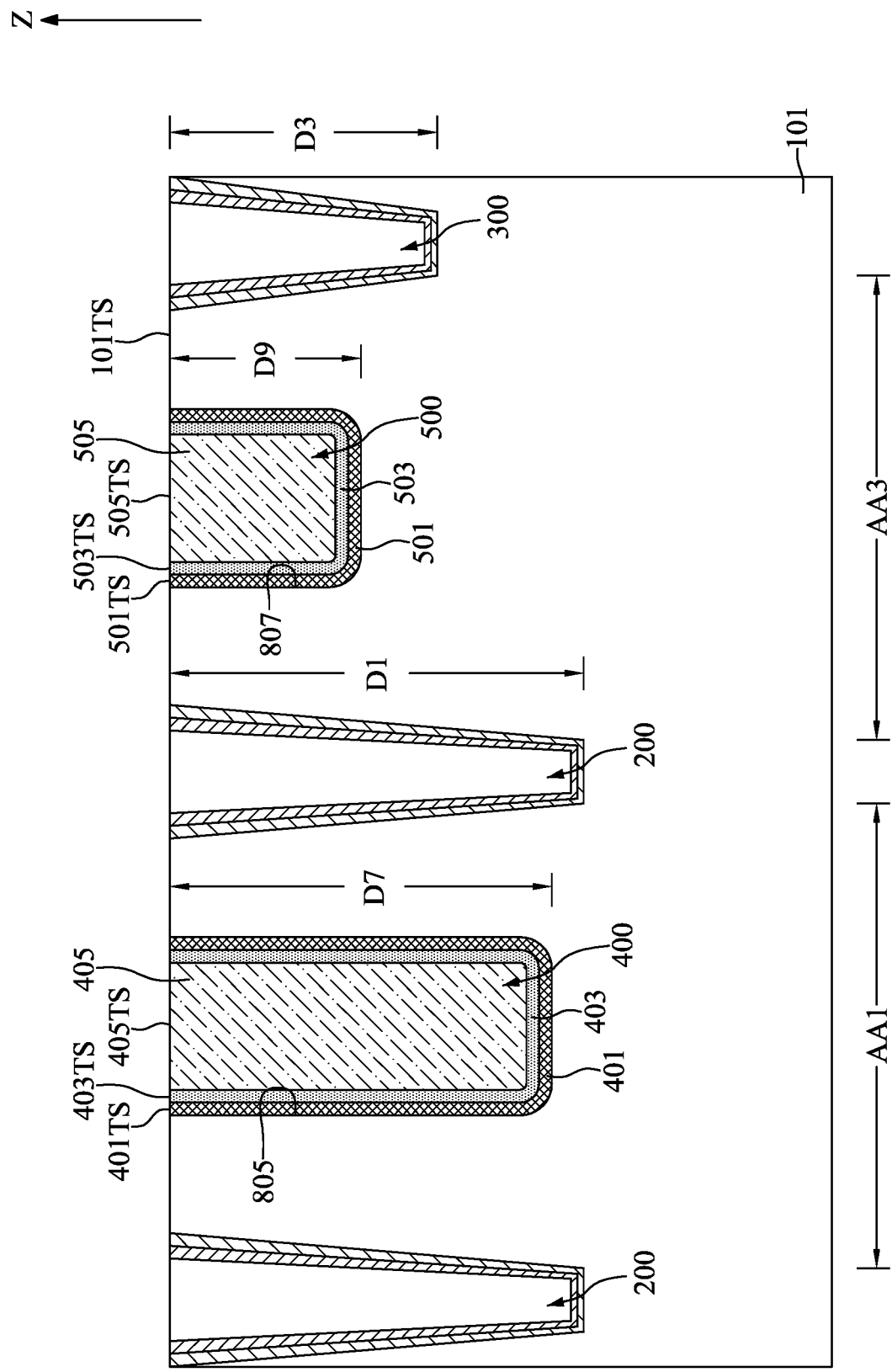

With reference to FIG. 11, a planarization process, such as chemical mechanical polishing, may be performed until the top surface of the substrate 101 is exposed to remove excess material, provide a substantially flat surface for subsequent processing steps. After the planarization process, the insulation material layer 605 may be turned into a first gate dielectric layer 401 in the first trench 805 and a second gate dielectric layer 501 in the second trench 807. The work function material layer 607 may be turned into a first gate electrode layer 403 in the first trench 805 and a second gate electrode layer 503 in the second trench 807. The filler material layer 609 may be turned into a first gate filler layer 405 in the first trench 805 and a second gate filler layer 505 in the second trench 807. The first gate dielectric layer 401, the first gate electrode layer 403, and the first gate filler layer 405 together configure the first gate structure 400. The second gate dielectric layer 501, the second gate electrode layer 503, and the second gate filler layer 505 together configure the second gate structure 500.

With reference to FIG. 11, the profile of the first gate structure 400 may be inherited from the first trench 805 and the profile of the second gate structure 500 may be inherited from the second trench 807. The first gate dielectric layer 401 and the first gate electrode layer 403 may respectively extend along the inner surfaces of the first trench 805 and the second trench 807 to form U-shaped cross-sectional profiles. The first gate electrode layer 403 and the second gate electrode layer 503 may have U-shaped cross-sectional profiles.

With reference to FIG. 11, the top surfaces 401TS of the first gate dielectric layer 401, the top surfaces 403TS of the first gate electrode layer 403, and the top surface 405TS of the first gate filler layer 405 may be substantially coplanar and may be referred to as the top surface of the first gate structure 400. The top surfaces 501TS of the second gate dielectric layer 501, the top surfaces 503TS of the second gate electrode layer 503, and the top surface 505TS of the second gate filler layer 505 may be substantially coplanar and may be referred to as the top surface of the second gate structure 500. The top surface of the first gate structure 400 and the top surface of the second gate structure 500 may be substantially coplanar with the top surface 101TS of the substrate 101. The first gate structure 400 may have the same depth as the depth D7 of the first trench 805 and the second gate structure 500 may have the same depth as the depth D9 of the second trench 807. Due to the different depths of the first gate structure 400 and the second gate structure 500, the first gate structure 400 and the second gate structure 500 may have different threshold voltages that can be used for different applications.

Figure 12:
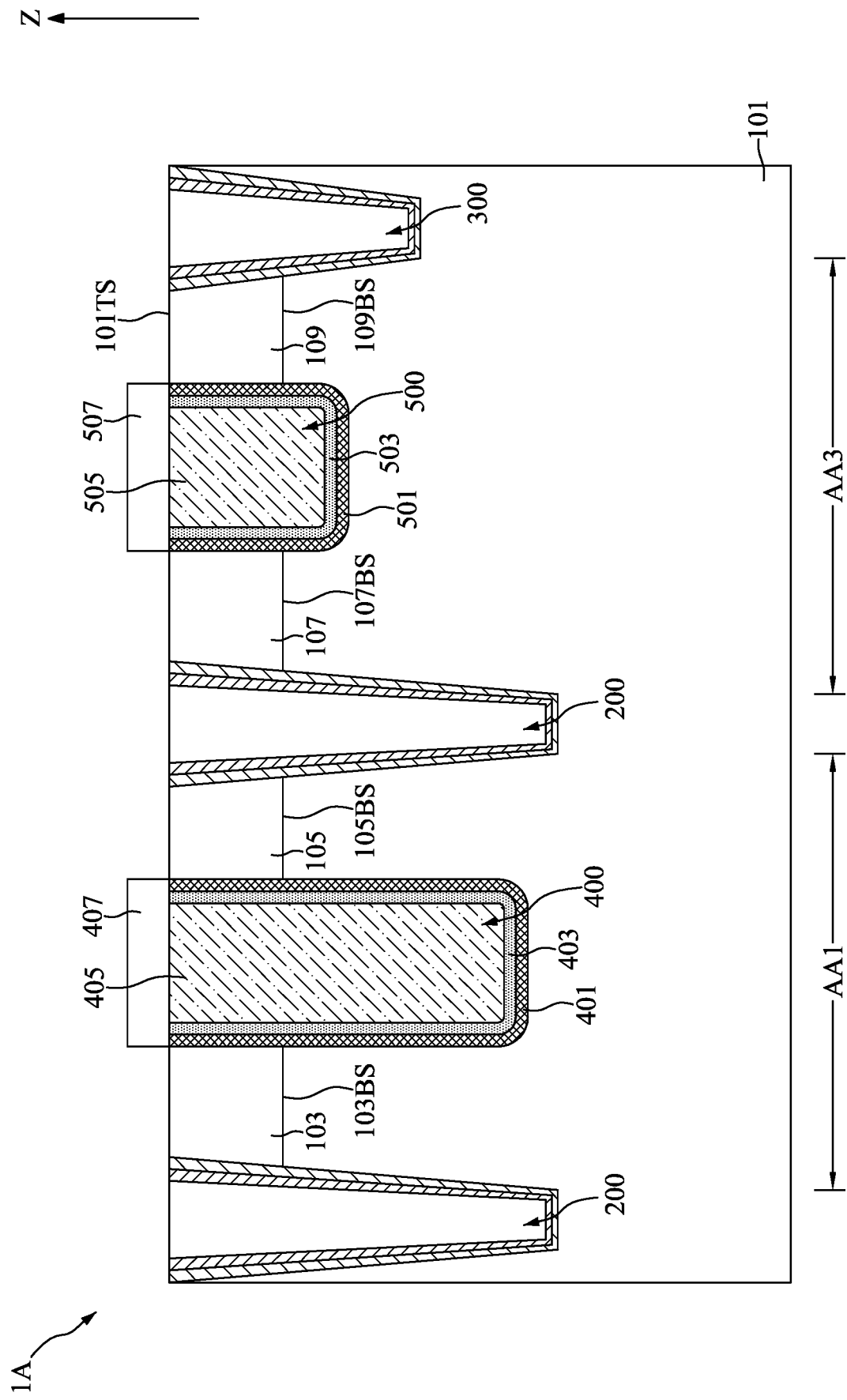

With reference to FIGS. 1 and 12, at step S19, a first capping layer 407 may be formed on the first gate structure 400, a second capping layer 507 may be formed on the second gate structure 500, first impurity regions 103, 105 may be formed on two sides of the first gate structure 400, and second impurity regions 107, 109 may be formed on two sides of the second gate structure 500.

With reference to FIG. 12, the first capping layer 407 may be formed on the substrate 101 and may cover the first gate dielectric layer 401, the first gate electrode layer 403, and the first gate filler layer 405. The second capping layer 507 may be formed on the substrate 101 and may cover the second gate dielectric layer 501, the second gate electrode layer 503, and the second gate filler layer 505. The first capping layer 407 and the second capping layer 507 may be formed of, for example, silicon oxide, silicon nitride, silicon oxynitride, silicon nitride oxide, or a combination thereof.

With reference to FIG. 12, the first impurity regions 103, 105 and the second impurity regions 107, 109 may be formed in the substrate 101 by an implantation process. During the implantation process, the first capping layer 407 and the first gate filler layer 405 may serve as masks to substantially prevent dopants from being implanted into the first gate structure 400 and the second gate structure 500. The dopants of the implantation process may include p-type impurities or n-type impurities. The p-type impurities may be added to an intrinsic semiconductor to create deficiencies of valence electrons. In a silicon-containing substrate, examples of p-type dopants, i.e., impurities include but are not limited to: boron, aluminum, gallium and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic and phosphorous.

In some embodiments, an anneal process may be performed to activate the first impurity regions 103, 105 and the second impurity regions 107, 109. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

In some embodiments, the first impurity regions 103, 105 and the second impurity regions 107, 109 may have a same electrical type such as p-type or n-type. In some embodiments, the first impurity regions 103, 105 and the second impurity regions 107, 109 may have different electrical types. In some embodiments, the bottom surfaces 103BS, 105BS of the first impurity regions 103, 105 may be at a same vertical level as the bottom surfaces 107BS, 109BS of the second impurity regions 107, 109. In some embodiments, the dopant concentration of the first impurity regions 103, 105 and the second impurity regions 107, 109 may be between about 1E19 atoms/cm^3 and about 1E21 atoms/cm^3.

FIGS. 13 to 20 illustrate, in schematic cross-sectional view diagrams, semiconductor devices 1B, 1C, 1D, 1E, 1F, 1G, 1H, and 1I in accordance with some embodiments of the present disclosure.

Figure 13:
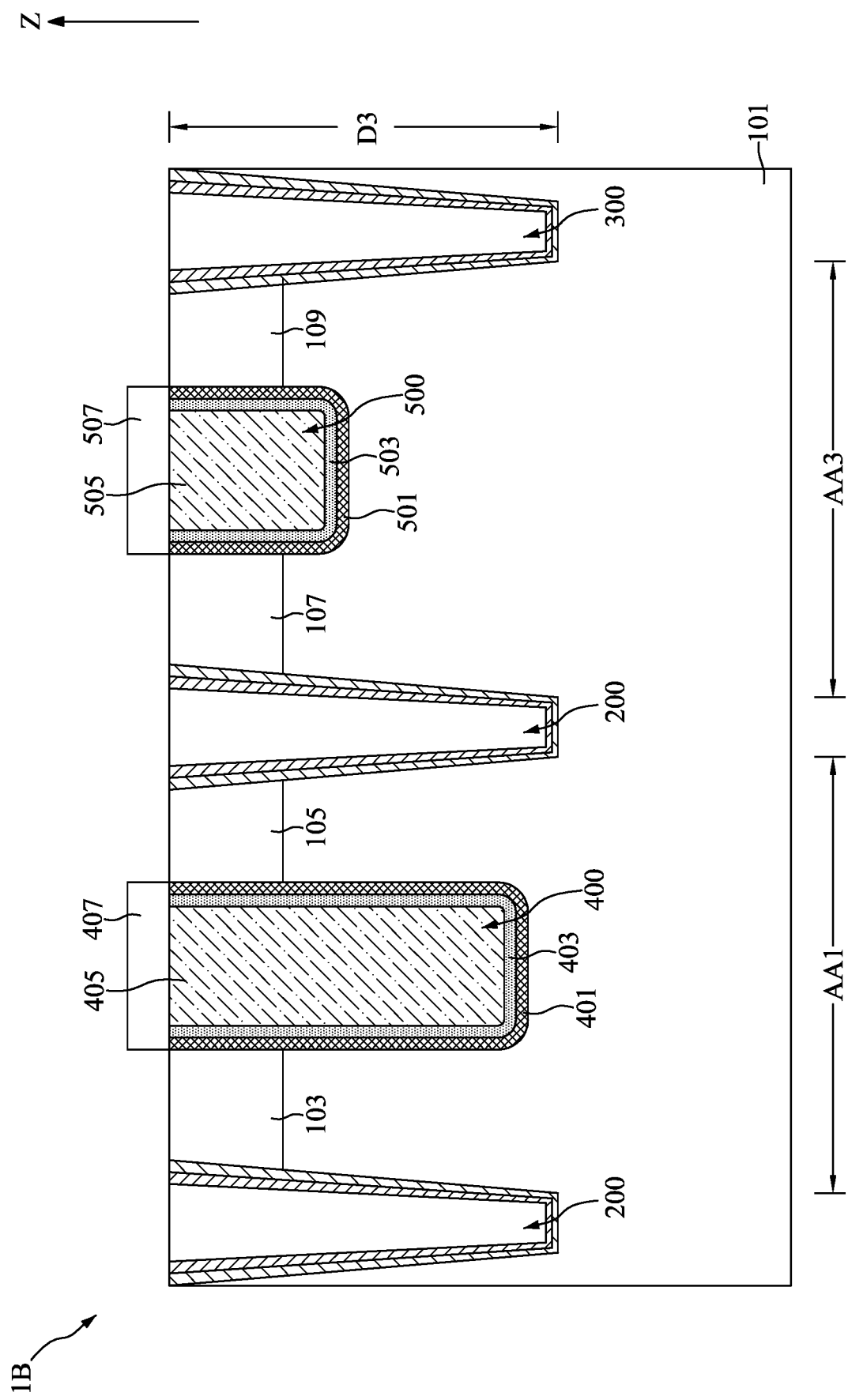
FIGS. 13 to 20 illustrate, in schematic cross-sectional view diagrams, semiconductor devices in accordance with some embodiments of the present disclosure.

With reference to FIG. 13, the semiconductor device 1B may have a structure similar to that illustrated in FIG. 12. The same or similar elements in FIG. 13 as in FIG. 12 have been marked with similar reference numbers and duplicative descriptions have been omitted. The depth D3 of the second isolation structure 300 may be the same as the depth D1 of the first isolation structures 200.

Figure 14:
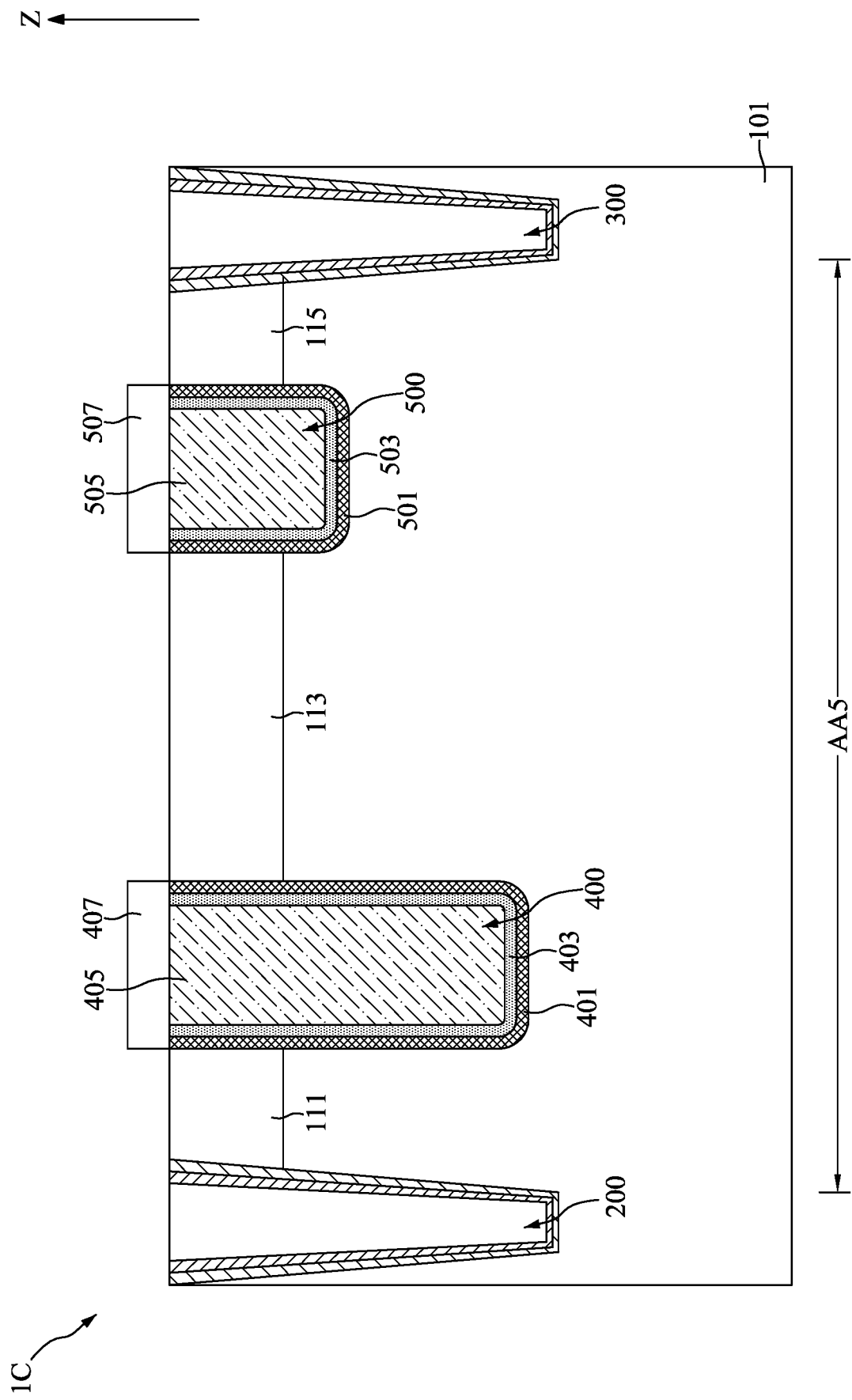

With reference to FIG. 14, the semiconductor device 1C may have a structure similar to that illustrated in FIG. 13. The same or similar elements in FIG. 14 as in FIG. 13 have been marked with similar reference numbers and duplicative descriptions have been omitted. The semiconductor device 1C may only include one first isolation structure 200 and one second isolation structure 300. The first isolation structure 200 may be disposed opposite to the second gate structure 500 with the first gate structure 400 interposed therebetween and may be disposed in the substrate 101. The second isolation structure 300 may be disposed opposite to the first gate structure 400 with the second gate structure 500 interposed therebetween and may be disposed in the substrate 101.

With reference to FIG. 14, third impurity regions 111, 113, 115 may be disposed in the substrate 101. The third impurity region 111 may be disposed between the first isolation structure 200 and the first gate structure 400. The third impurity region 113 may be disposed between the first gate structure 400 and the second gate structure 500. The third impurity region 115 may be disposed between the second gate structure 500 and the second isolation structure 300. In some embodiments, the third impurity regions 111, 115 may be referred to as drain regions of the first gate structure 400 and the second gate structure 500. The third impurity region 113 may be referred to as a common source region of the first gate structure 400 and the second gate structure 500.

Figure 15:
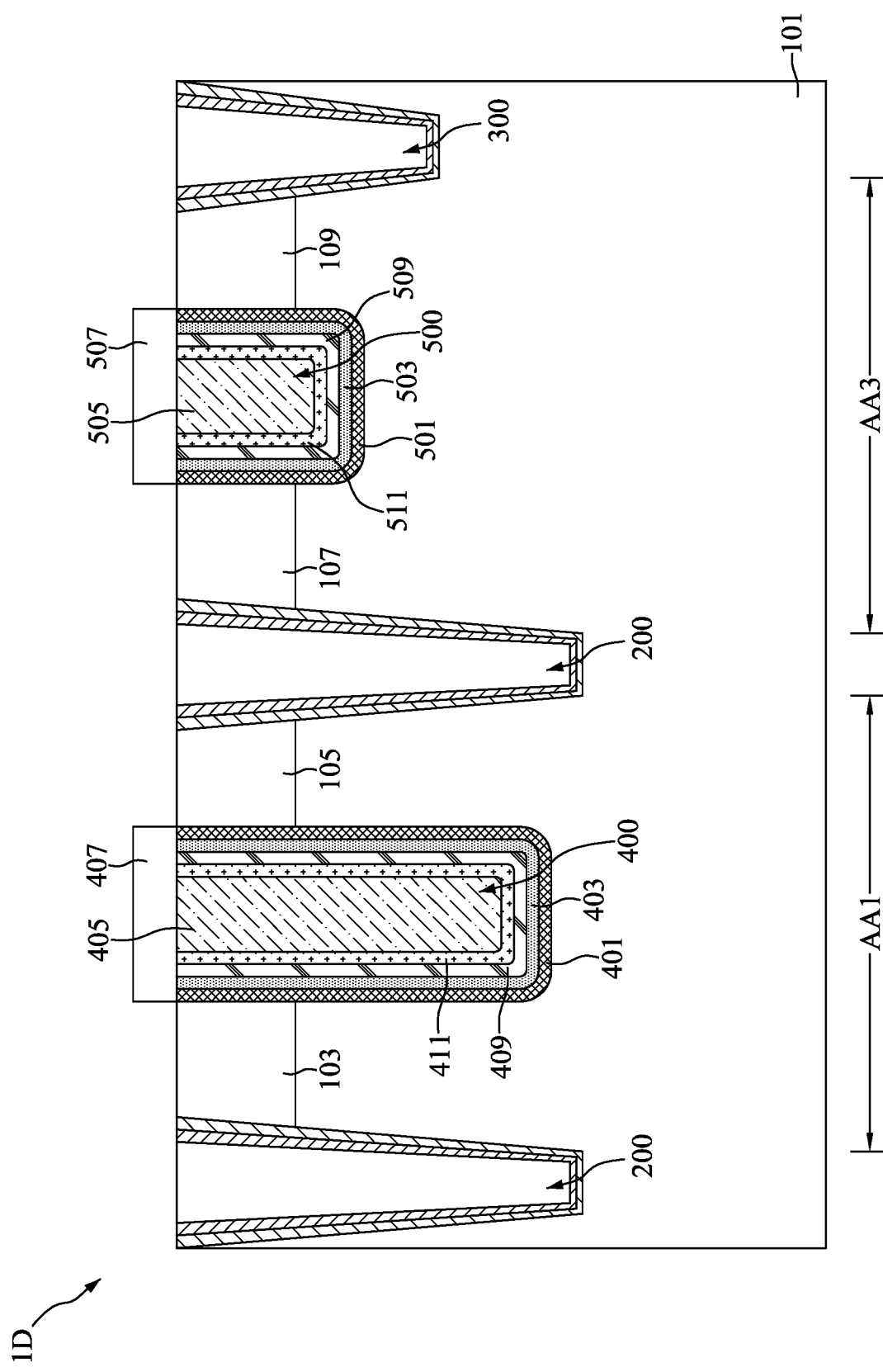

With reference to FIG. 15, the semiconductor device 1D may have a structure similar to that illustrated in FIG. 12. The same or similar elements in FIG. 15 as in FIG. 12 have been marked with similar reference numbers and duplicative descriptions have been omitted. The semiconductor device 1D may include a first wetting layer 409, a first barrier layer 411, a second wetting layer 509, and a second barrier layer 511.

With reference to FIG. 15, the first wetting layer 409 may be disposed between the first gate electrode layer 403 and the first gate filler layer 405. The second wetting layer 509 may be disposed between the second gate electrode layer 503 and the second gate filler layer 505. The first wetting layer 409 and the second wetting layer 509 may have U-shaped cross-sectional profiles. The first wetting layer 409 and the second wetting layer 509 may be formed of, for example, titanium, tantalum, nickel, or cobalt. The first wetting layer 409 and the second wetting layer 509 may be formed from a same layer and may be concurrently formed. The first wetting layer 409 and the second wetting layer 509 may be formed by, for example, atomic layer deposition, chemical vapor deposition, or sputtering. The first wetting layer 409 and the second wetting layer 509 may promote bonding between the layers and may promote uniform deposition of the subsequent layers.

With reference to FIG. 15, the first barrier layer 411 may be disposed between the first wetting layer 409 and the first gate filler layer 405. The second barrier layer 511 may be disposed between the second wetting layer 509 and the second gate filler layer 505. The first barrier layer 411 and the second barrier layer 511 may have U-shaped cross-sectional profiles. The first barrier layer 411 and the second barrier layer 511 may be formed of, for example, titanium nitride, tantalum nitride, or a combination thereof. The first barrier layer 411 and the second barrier layer 511 may be formed by, for example, atomic layer deposition, chemical vapor deposition, or sputtering. The first barrier layer 411 and the second barrier layer 511 may prevent subsequent deposition processes from degrading other layers of the semiconductor device 1D.

Figure 16:
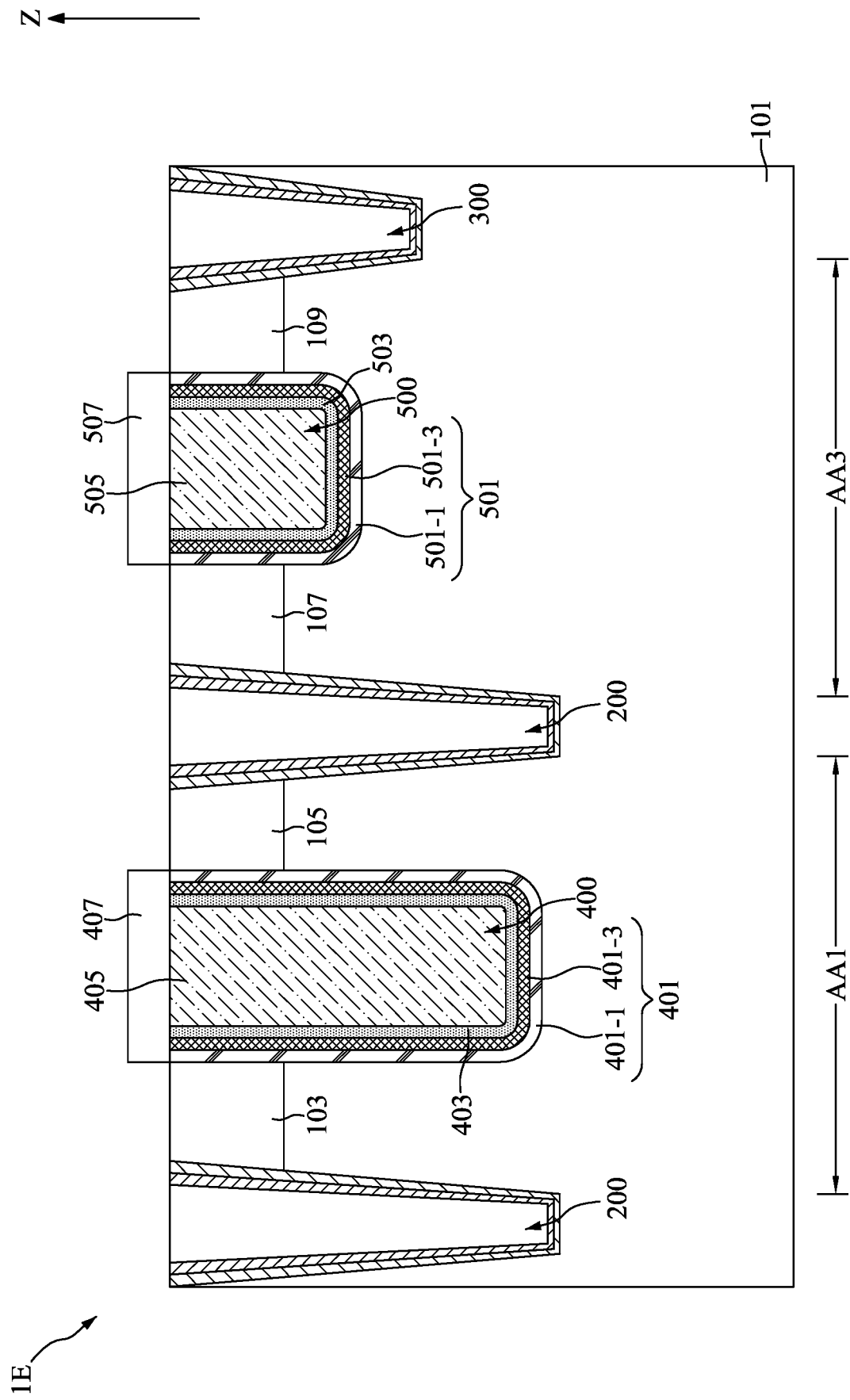

With reference to FIG. 16, the semiconductor device 1E may have a structure similar to that illustrated in FIG. 12. The same or similar elements in FIG. 16 as in FIG. 12 have been marked with similar reference numbers and duplicative descriptions have been omitted. The first gate dielectric layer 401 may be a multiple layered structure including a first bottom dielectric layer 401-1 inwardly positioned in the first active area AA1 of the substrate 101 and a first top dielectric layer 401-3 conformally disposed on the first bottom dielectric layer 401-1. The first top dielectric layer 401-3 may be disposed between the first gate electrode layer 403 and the first bottom dielectric layer 401-1. The first bottom dielectric layer 401-1 and the first top dielectric layer 401-3 may have U-shaped cross-sectional profiles.

With reference to FIG. 16, the second gate dielectric layer 501 may be a multiple layered structure including a second bottom dielectric layer 501-1 inwardly positioned in the second active area AA3 of the substrate 101 and a second top dielectric layer 501-3 conformally disposed on the second bottom dielectric layer 501-1. The second bottom dielectric layer 501-1 may be disposed between the second gate electrode layer 503 and the second bottom dielectric layer 501-1. The second bottom dielectric layer 501-1 and the second top dielectric layer 501-3 may have U-shaped cross-sectional profiles.

The first bottom dielectric layer 401-1 and the second bottom dielectric layer 501-1 may be formed of a same material. The second bottom dielectric layer 501-1 and the second top dielectric layer 501-3 may be formed of a same material. In some embodiments, the first bottom dielectric layer 401-1 and the second bottom dielectric layer 501-1 may be formed of, for example, high-k dielectric materials and the first top dielectric layer 401-3 and the second top dielectric layer 501-3 may be formed of, for example, silicon oxide. In some embodiments, the first bottom dielectric layer 401-1 and the second bottom dielectric layer 501-1 may be formed of, for example, silicon oxide and the first top dielectric layer 401-3 and the second top dielectric layer 501-3 may be formed of, for example, high-k dielectric materials.

Figure 17:
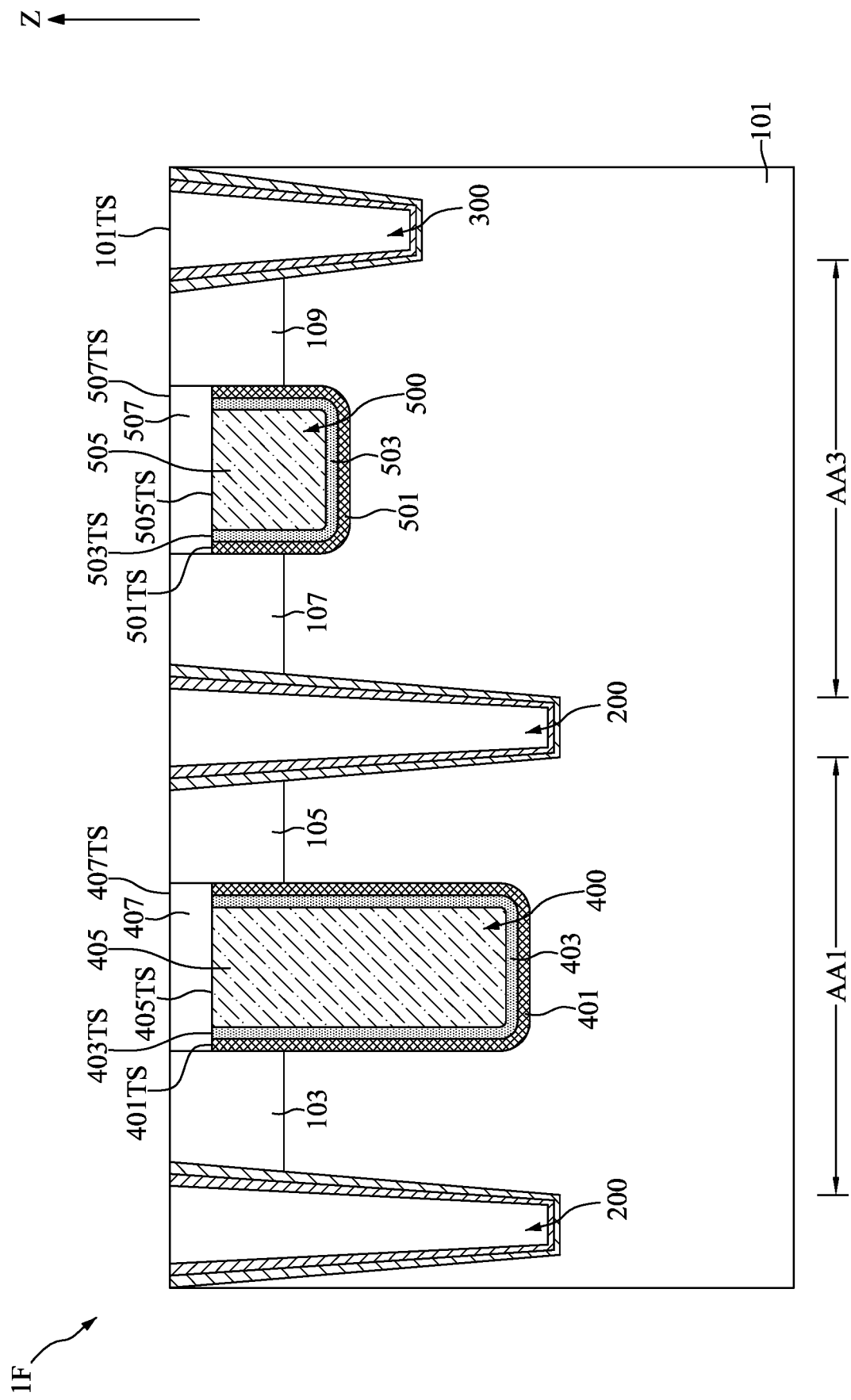

With reference to FIG. 17, the semiconductor device 1F may have a structure similar to that illustrated in FIG. 12. The same or similar elements in FIG. 17 as in FIG. 12 have been marked with similar reference numbers and duplicative descriptions have been omitted.

With reference to FIG. 17, the first gate dielectric layer 401, the first gate electrode layer 403, the first gate filler layer 405, the second gate dielectric layer 501, the second gate electrode layer 503, and the second gate filler layer 505 may be recessed. In other words, the top surfaces 401TS of the first gate dielectric layer 401, the top surfaces 403TS of the first gate electrode layer 403, the top surface 405TS of the first gate filler layer 405, the top surfaces 501TS of the second gate dielectric layer 501, the top surfaces 503TS of the second gate electrode layer 503, the top surface 505TS of the second gate filler layer 505 may be at a vertical level lower than a vertical level of the top surface 101TS of the substrate 101. The first capping layer 407 may be disposed on the first gate dielectric layer 401, the first gate electrode layer 403, and the first gate filler layer 405 and disposed in the substrate 101. The second capping layer 507 may be disposed on the second gate dielectric layer 501, the second gate electrode layer 503, and the second gate filler layer 505 and disposed in the substrate 101. The top surface 407TS of the first capping layer 407 and the top surface 507TS of the second capping layer 507 may be substantially coplanar with the top surface 101TS of the substrate 101.

Figure 18:
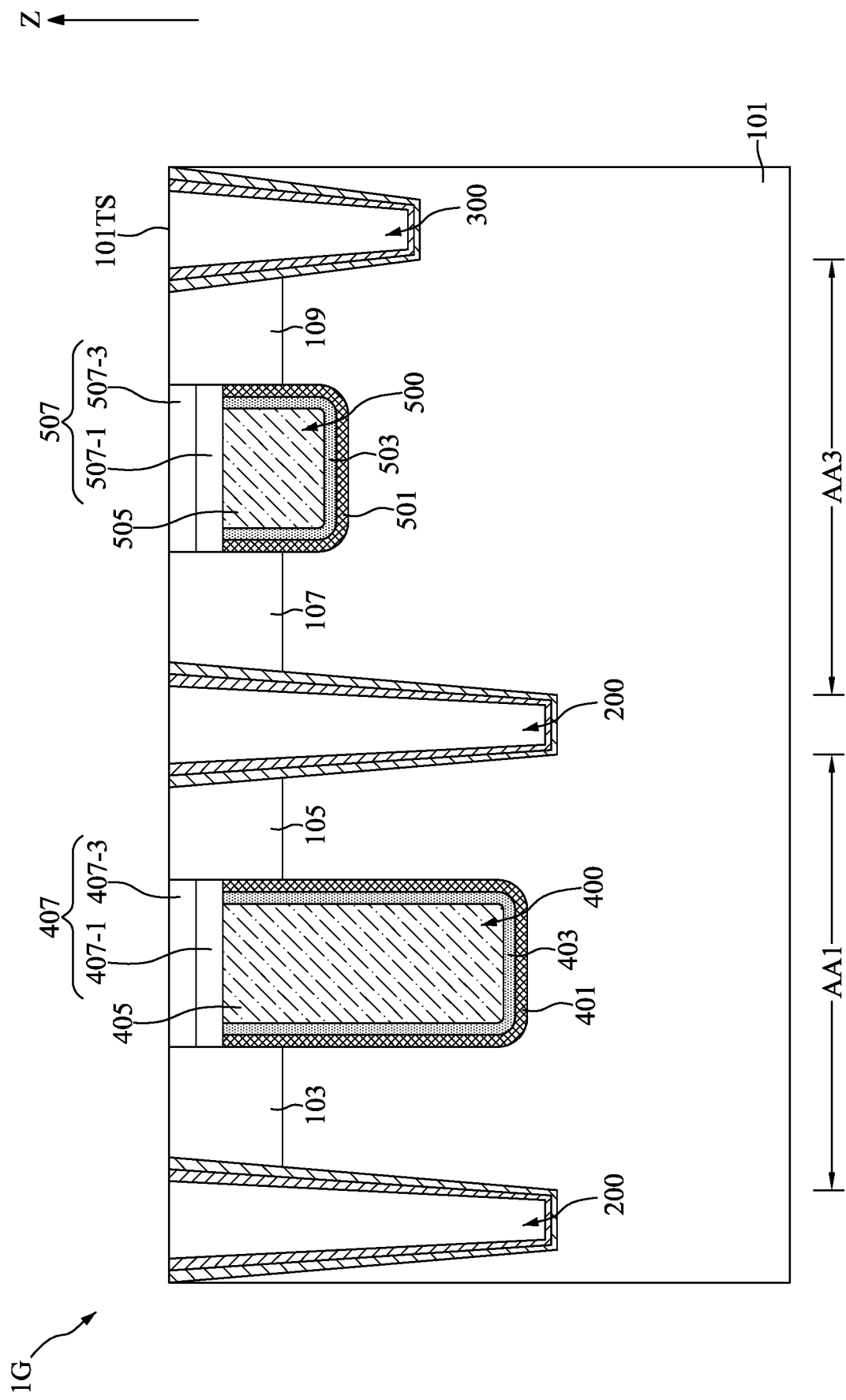

With reference to FIG. 18, the semiconductor device 1G may have a structure similar to that illustrated in FIG. 17. The same or similar elements in FIG. 18 as in FIG. 17 have been marked with similar reference numbers and duplicative descriptions have been omitted. The first capping layer 407 may include a first bottom capping layer 407-1 and a first top capping layer 407-3. The second capping layer 507 may include a second bottom capping layer 507-1 and a second top capping layer 507-3.

With reference to FIG. 18, the first bottom capping layer 407-1 may be disposed on the first gate dielectric layer 401, the first gate electrode layer 403, and the first gate filler layer 405. The first top capping layer 407-3 may be disposed on the first bottom capping layer 407-1. The second bottom capping layer 507-1 may be disposed on the second gate dielectric layer 501, the second gate electrode layer 503, and the second gate filler layer 505. The second top capping layer 507-3 may be disposed on the second bottom capping layer 507-1. The top surface of the first bottom capping layer 407-1 and the top surface of the second bottom capping layer 507-1 may be substantially coplanar with the top surface 101TS of the substrate 101. The first bottom capping layer 407-1 and the second bottom capping layer 507-1 may be formed of high-k dielectric materials. The first top capping layer 407-3 and the second top capping layer 507-3 may be formed of a low dielectric-constant material such as silicon oxide. The first top capping layer 407-3 and the second top capping layer 507-3 formed of the low dielectric-constant material may reduce electric field at the top surface 101TS of the substrate 101; therefore, leakage current may be reduced.

Figure 19:
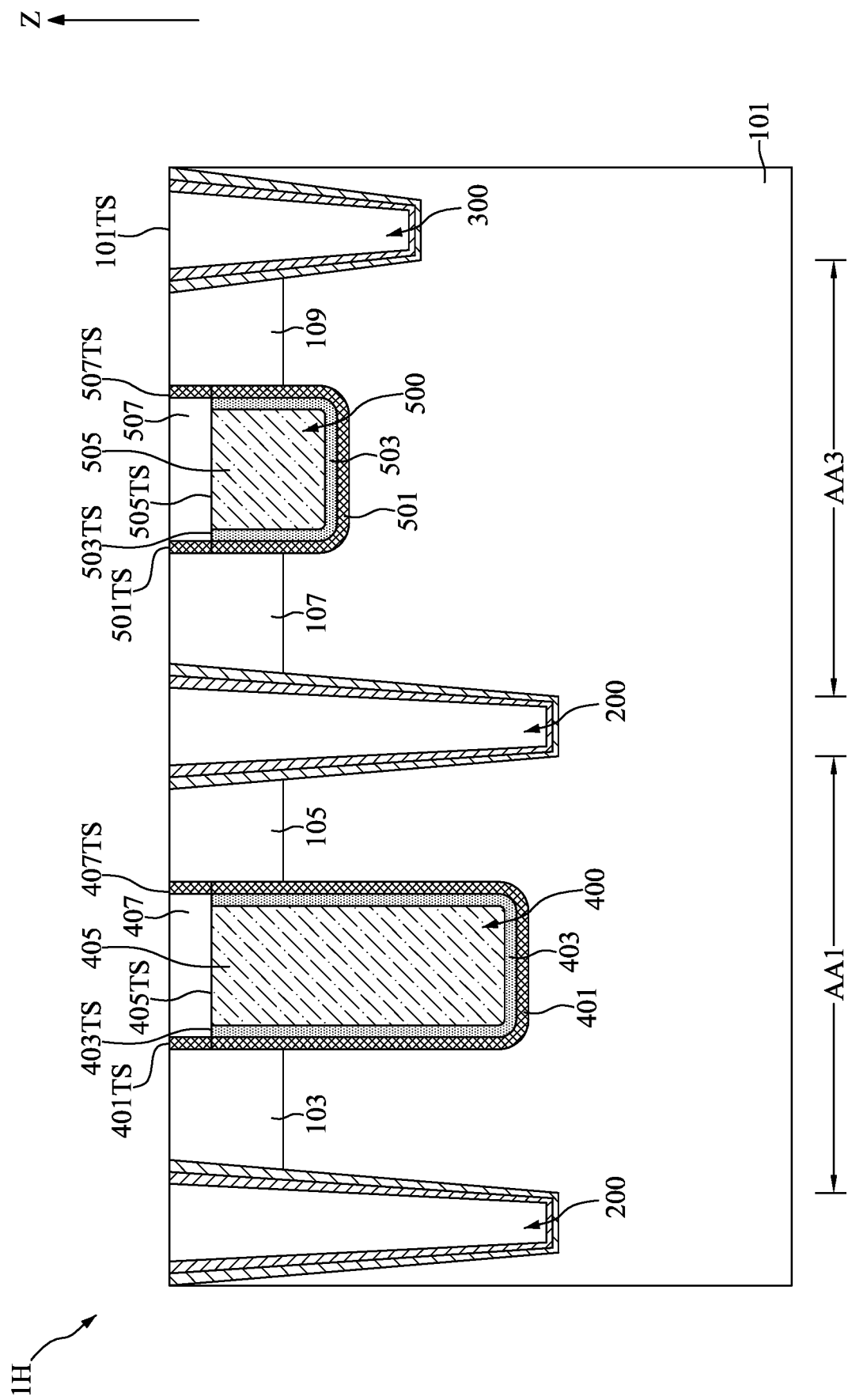

With reference to FIG. 19, the semiconductor device 1H may have a structure similar to that illustrated in FIG. 12. The same or similar elements in FIG. 19 as in FIG. 12 have been marked with similar reference numbers and duplicative descriptions have been omitted.

With reference to FIG. 19, the first gate electrode layer 403, the first gate filler layer 405, the second gate electrode layer 503, and the second gate filler layer 505 may be recessed. In other words, the top surfaces 403TS of the first gate electrode layer 403, the top surface 405TS of the first gate filler layer 405, the top surfaces 503TS of the second gate electrode layer 503, the top surface 505TS of the second gate filler layer 505 may be at a vertical level lower than a vertical level of the top surface 101TS of the substrate 101, the top surfaces 401TS of the first gate dielectric layer 401, and the top surfaces 501TS of the second gate dielectric layer 501. The first capping layer 407 may be disposed on the first gate electrode layer 403 and the first gate filler layer 405 and disposed between the inner surfaces of the first gate dielectric layer 401. The second capping layer 507 may be disposed on the second gate electrode layer 503 and the second gate filler layer 505 and disposed between the inner surfaces of the second gate dielectric layer 501. The top surface 407TS of the first capping layer 407 and the top surface 507TS of the second capping layer 507 may be substantially coplanar with the top surface 101TS of the substrate 101, the top surfaces 401TS of the first gate dielectric layer 401, and the top surfaces 501TS of the second gate dielectric layer 501.

Figure 20:
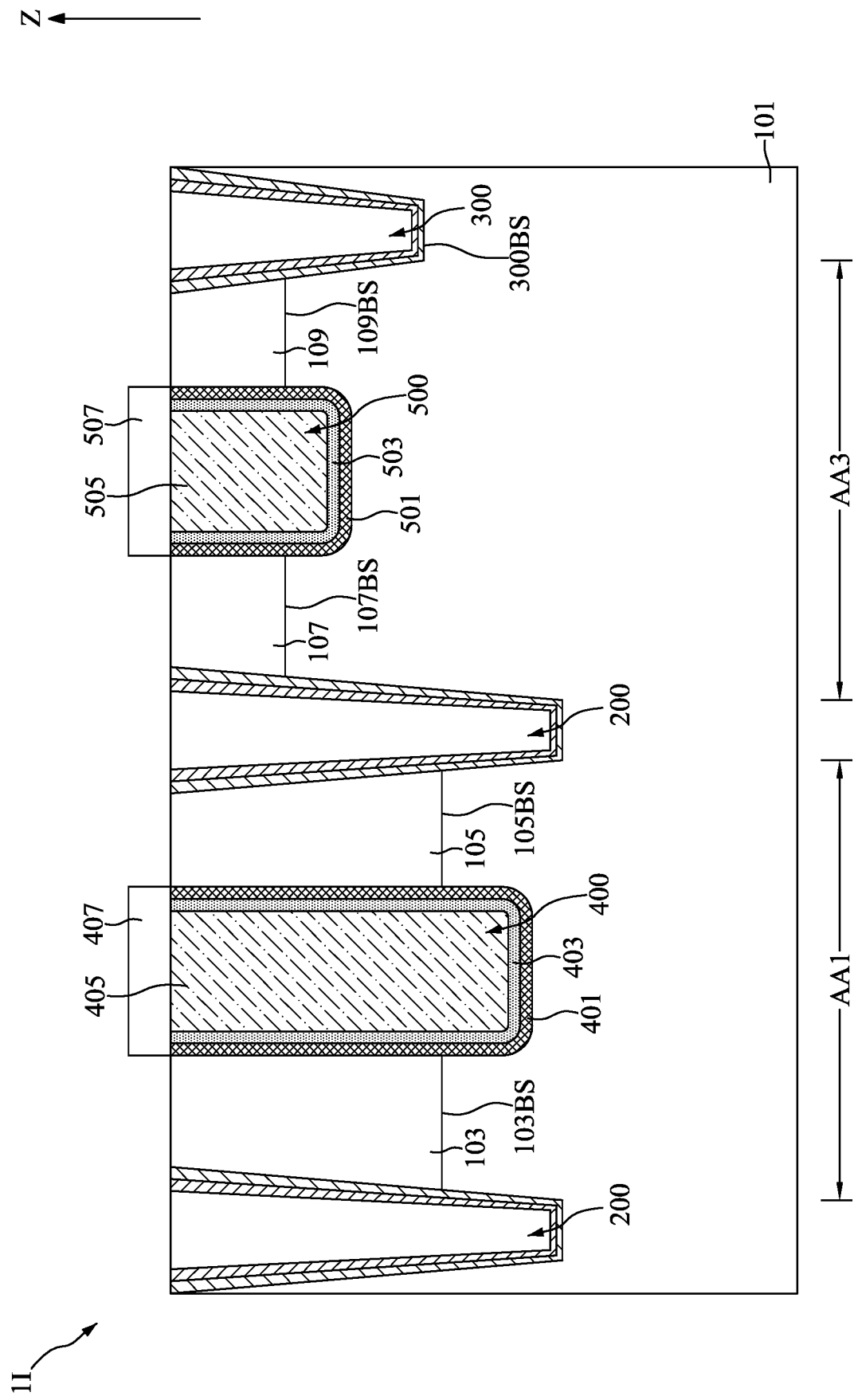

With reference to FIG. 20, the semiconductor device 1I may have a structure similar to that illustrated in FIG. 12. The same or similar elements in FIG. 20 as in FIG. 12 have been marked with similar reference numbers and duplicative descriptions have been omitted. The bottom surfaces 103BS, 105BS of the first impurity regions 103, 105 may be at a vertical level lower than a vertical level of the bottom surfaces 107BS, 109BS of the second impurity regions 107, 109. In some embodiments, the bottom surfaces 103BS, 105BS of the first impurity regions 103, 105 may be at a vertical level lower than a vertical level of the bottom surface of the second isolation structure 300. In some embodiments, the bottom surfaces 103BS, 105BS of the first impurity regions 103, 105 may be at a vertical level higher than a vertical level of the bottom surface of the second isolation structure 300.

FIGS. 21 to 28 illustrate, in schematic cross-sectional view diagrams, a flow for fabricating a semiconductor device 1J in accordance with another embodiment of the present disclosure.

Figure 21:
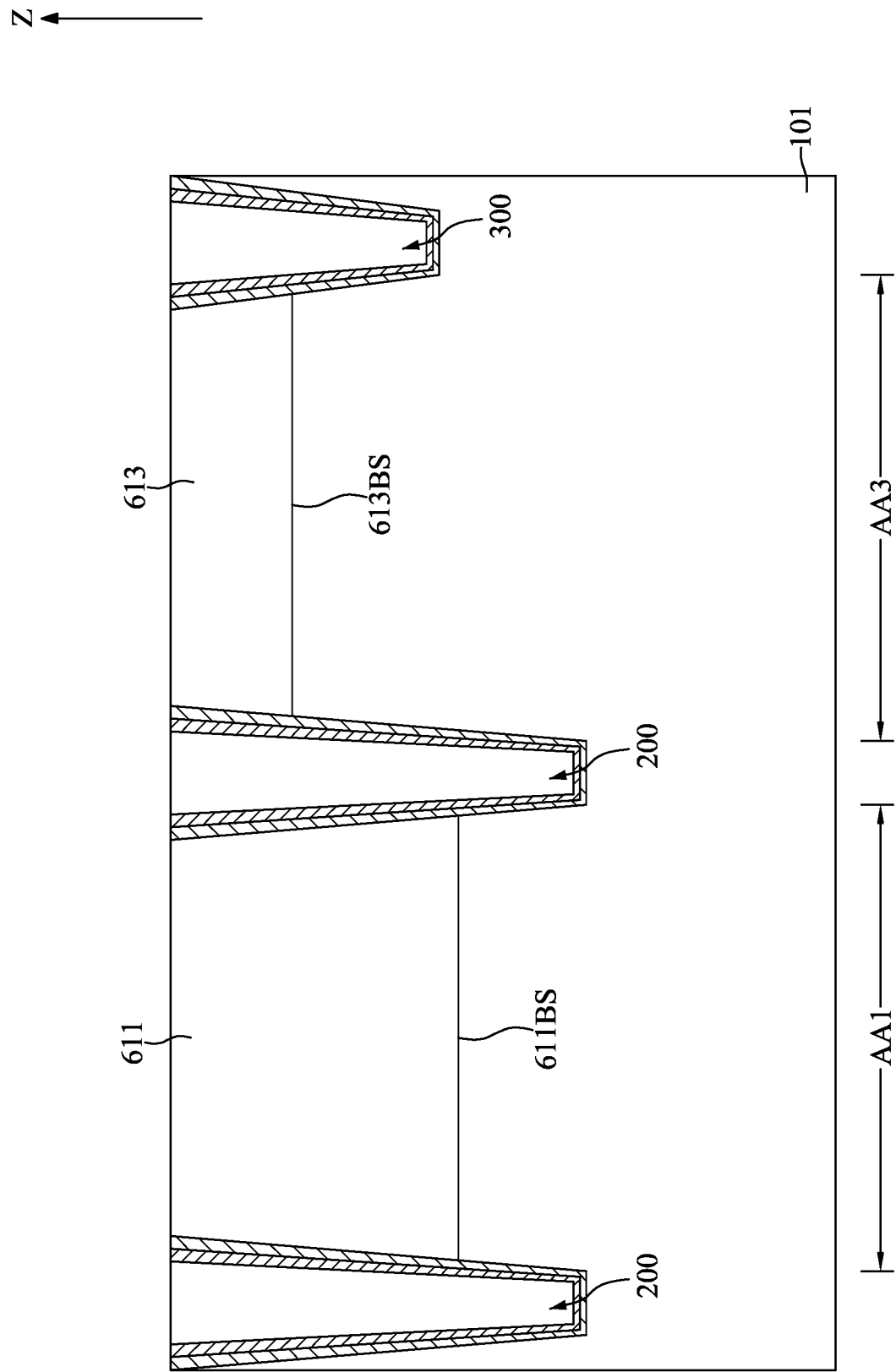
FIGS. 21 to 28 illustrate, in schematic cross-sectional view diagrams, a flow for fabricating a semiconductor device in accordance with another embodiment of the present disclosure.

With reference to FIG. 21, an intermediate semiconductor device may be fabricating with a procedure similar to that illustrated in FIGS. 2 to 5. A first doped region 611 and a second doped region 613 may be respectively formed in the first active area AA1 and the second active area AA3. The first doped region 611 and the second doped region 613 may be doped with a dopant such as phosphorus, arsenic, antimony, or boron. The bottom surface 611BS of the first doped region 611 may be at a vertical level lower than a vertical level of the bottom surface 613BS of the second doped region 613.

Figure 22:
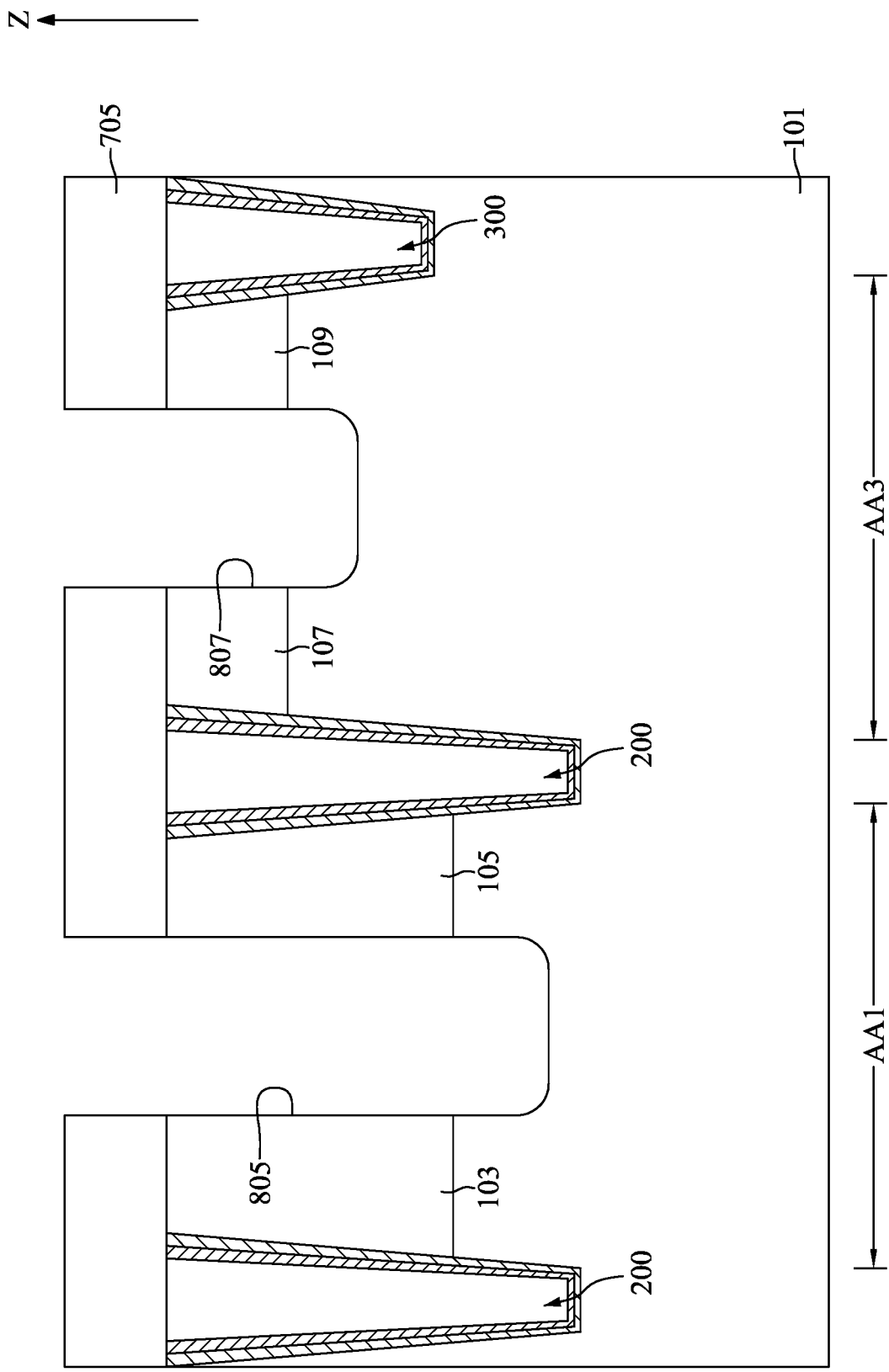

With reference to FIG. 22, the first trench 805, the second trench 807 may be formed with a procedure similar to that illustrated in FIGS. 6 and 7.

Figure 23:
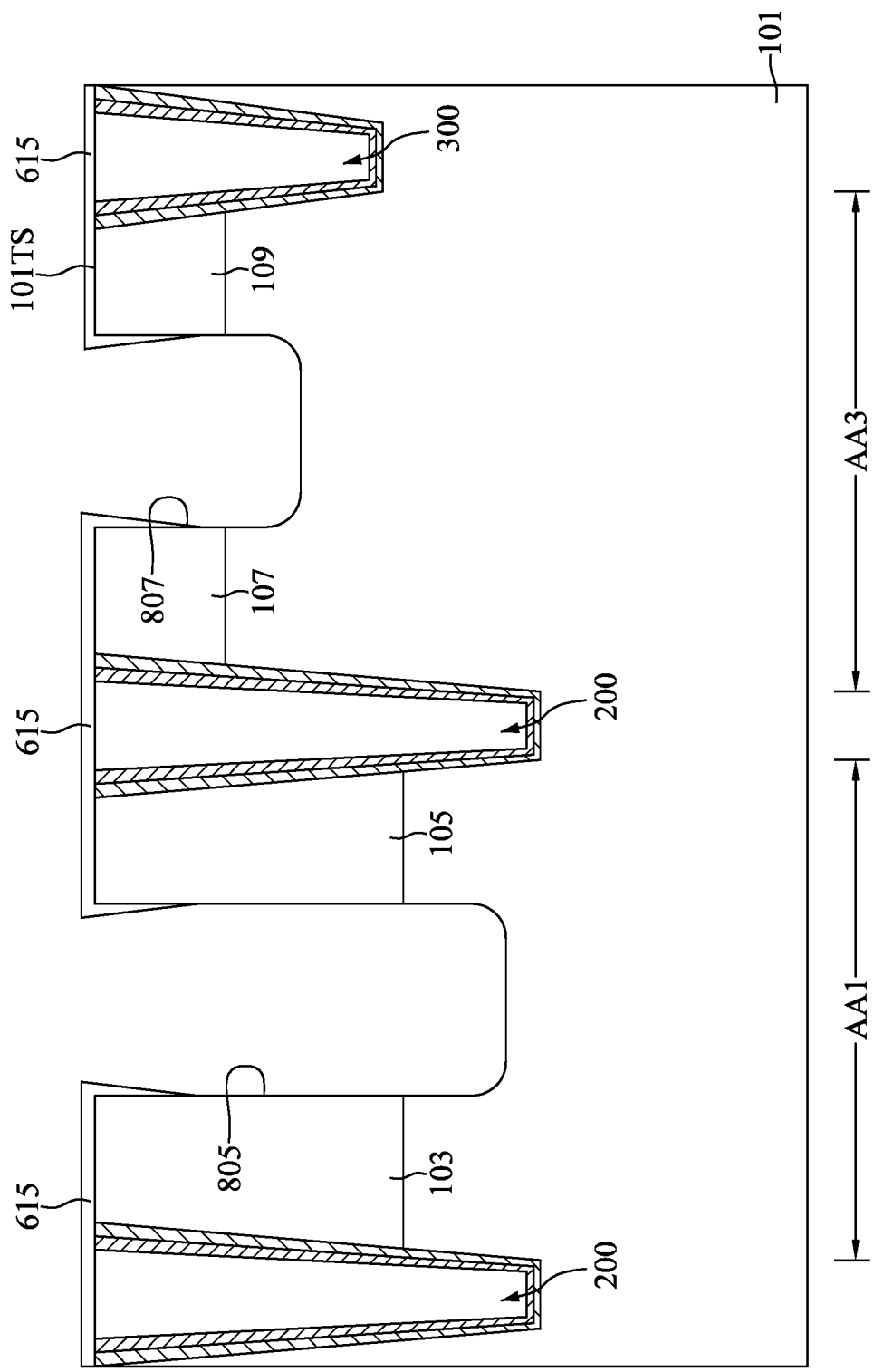

With reference to FIG. 23, coverage layers 615 may be formed to cover upper portions of the inner surfaces of the first trench 805 and the second trench 807. The coverage layers 615 may also cover top surface 101 of the substrate 101. The coverage layers 615 may be formed by a deposition process such as an atomic layer deposition method precisely controlling an amount of a first precursor of the atomic layer deposition method. The coverage layers 615 may be formed of, for example, aluminum oxide, hafnium oxide, zirconium oxide, titanium oxide, titanium nitride, tungsten nitride, silicon nitride, or silicon oxide.

Figure 24:
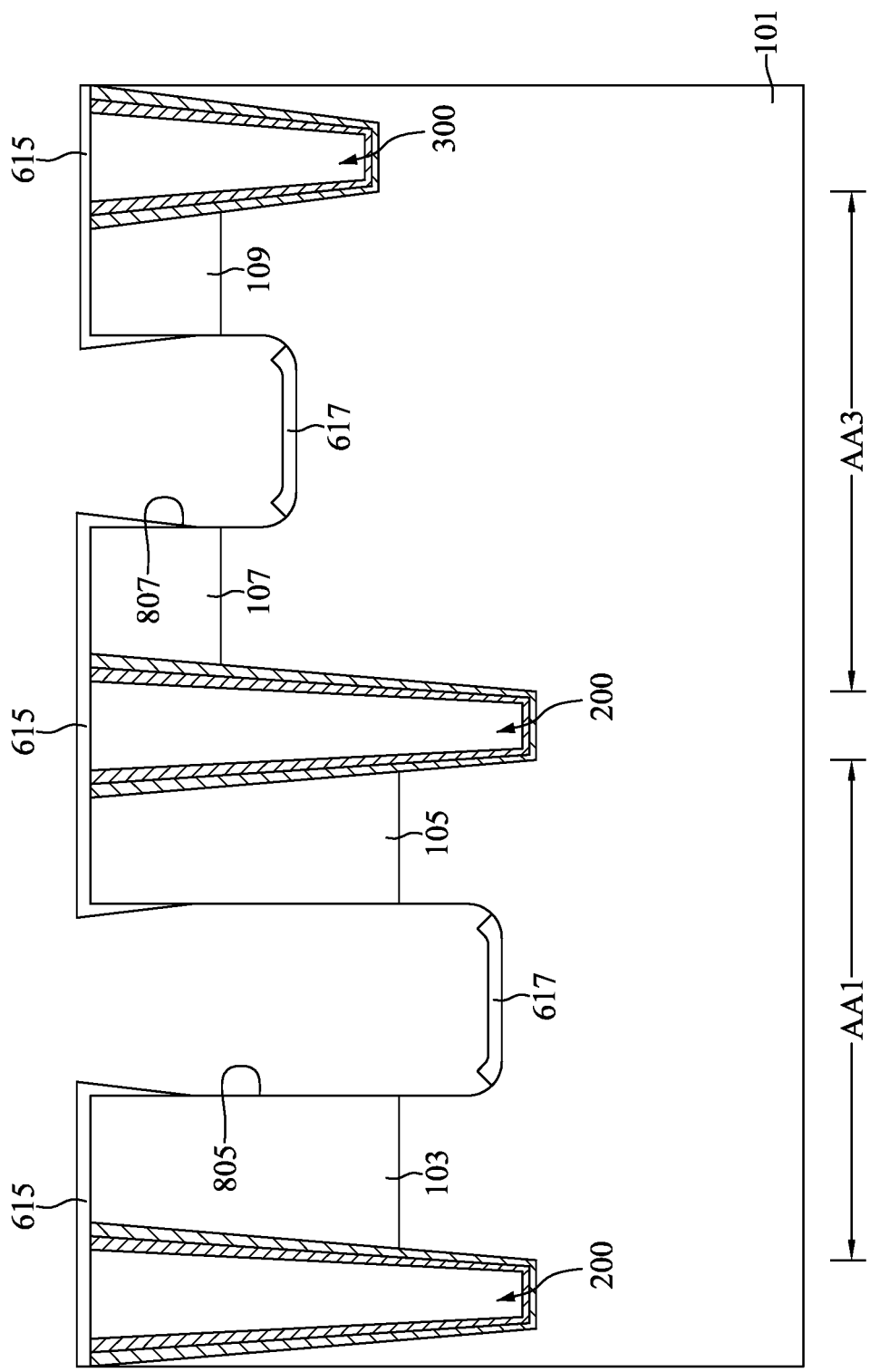

With reference to FIG. 24, bottom mask layers 617 may be respectively correspondingly formed on the bottoms of the first trench 805 and the second trench 807. The bottom mask layers 617 may be formed of, for example, silicon oxide or the like. The bottom mask layers 617 may be formed by a deposition process and a subsequent etch process selective to the coverage layers 615.

Figure 25:
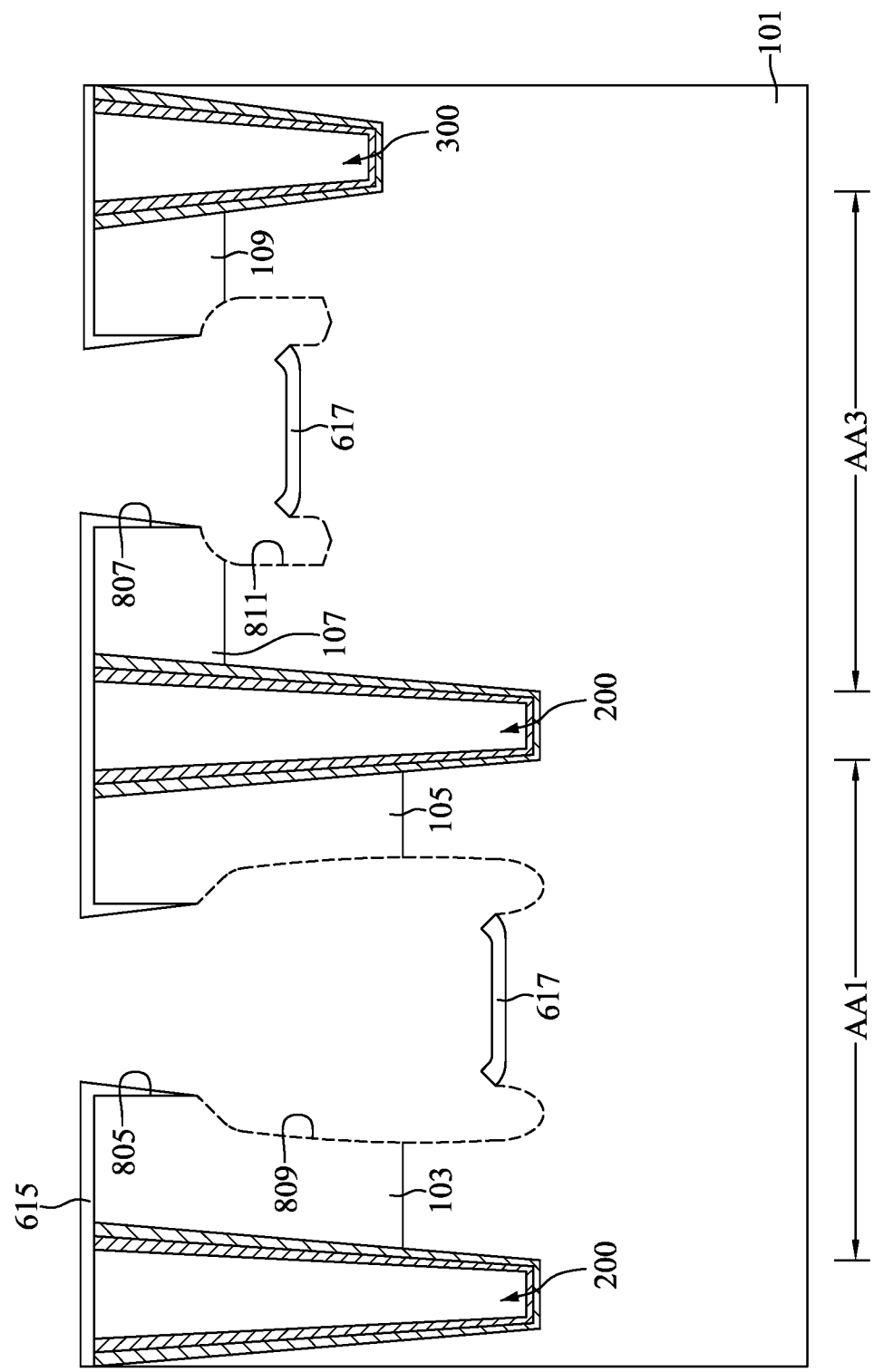

With reference to FIG. 25, first side spaces 809 may extend outwardly from lower portions of the inner surface of the first trench 805 and second side spaces 811 may extend outwardly from lower portions of the inner surface of the second trench 807. The first side spaces 809 and the second trench 807 may be formed by an etch process such as wet etch. The bottom mask layers 617 may serve as a protection layer to prevent regions below the bottom mask layers 617 from being etched during the etch process; in other words, the region below the bottom mask layers 617 may remain intact. In addition, the coverage layers 615 may also serve as protection layers for the upper portions of the first impurity regions 103, 105 and the second impurity regions 107, 109 during the etch process.

Figure 26:
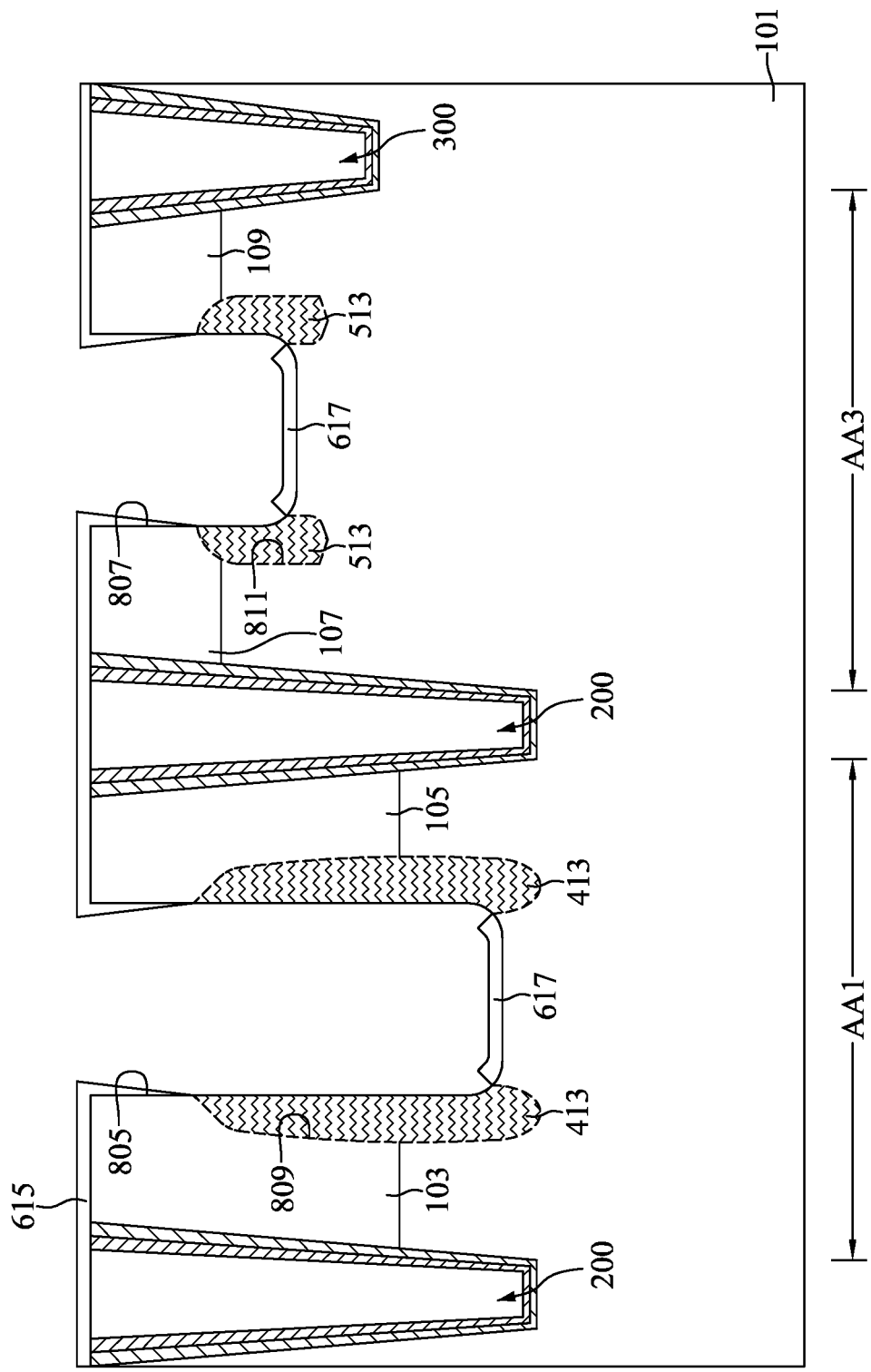

With reference to FIG. 26, first stress regions 413 may be formed in the first side spaces 809 and second stress regions 513 may be formed in the second side spaces 811. The first stress regions 413 and the second stress regions 513 may be formed by an epitaxial growth process such as rapid thermal chemical vapor deposition, low-energy plasma deposition, ultra-high vacuum chemical vapor deposition, atmospheric pressure chemical vapor deposition, or molecular beam epitaxy. In some embodiments, the first stress regions 413 and the second stress regions 513 may be formed concurrently and may have a same lattice constant.

In some embodiments, the epitaxial material for a n-type device may include Si, SiC, SiCP, SiGeP, SiP, SiGeSnP, or the like, and the epitaxial material for a p-type device may include SiGe, SiGeB, Ge, GeB, GeSn, GeSnB, a boron-doped III-V compound material, or the like.

In some embodiments, dopants may be incorporated in-situ using appropriate precursors. The dopant concentration of the first stress regions 413 and the second stress regions 513 may be between about 1E19 atoms/cm^3 and about 1E21 atoms/cm^3. It should be noted that the term "in-situ" means that the dopant that dictates the conductivity type of a doped layer is introduced during the process step, for example epitaxial deposition, that forms the doped layer. The term "conductivity type" denotes a dopant region being p-type or n-type.

In some embodiments, an epitaxy preclean process may be employed to remove the thin layers of oxide material at the inner surfaces of first side spaces 809 and the second side spaces 811. The epitaxy preclean process may be a plasma-assisted dry etch process that involves simultaneous exposure of a substrate to hydrogen, $NF_3$ and $NH_3$ plasma by-products or a wet etch using a solution containing hydrofluoric acid.

Figure 27:
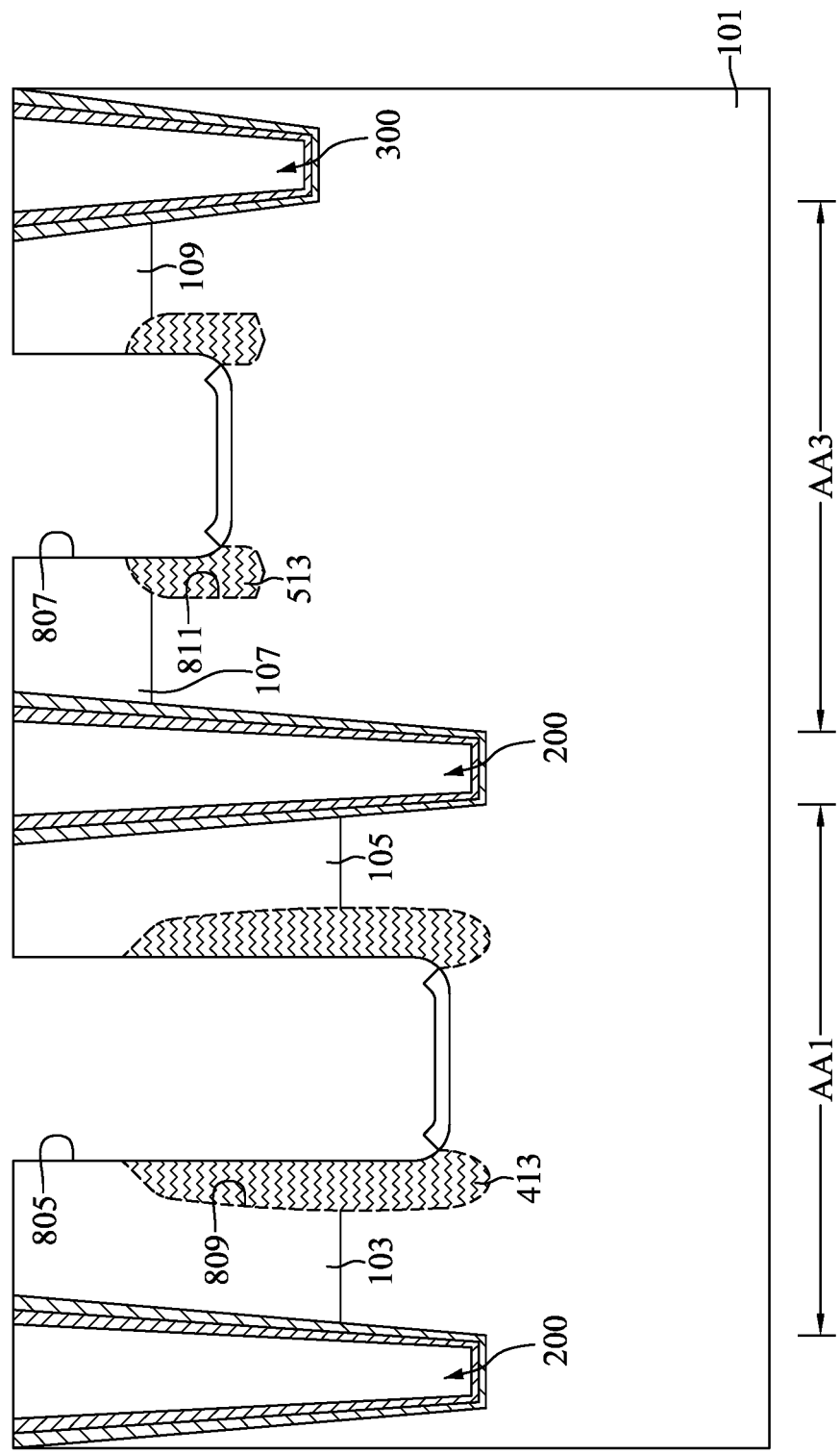

With reference to FIG. 27, the coverage layers 615 and the bottom mask layers 617 may be removed by etch processes such as wet etch or dry etch.

Figure 28:
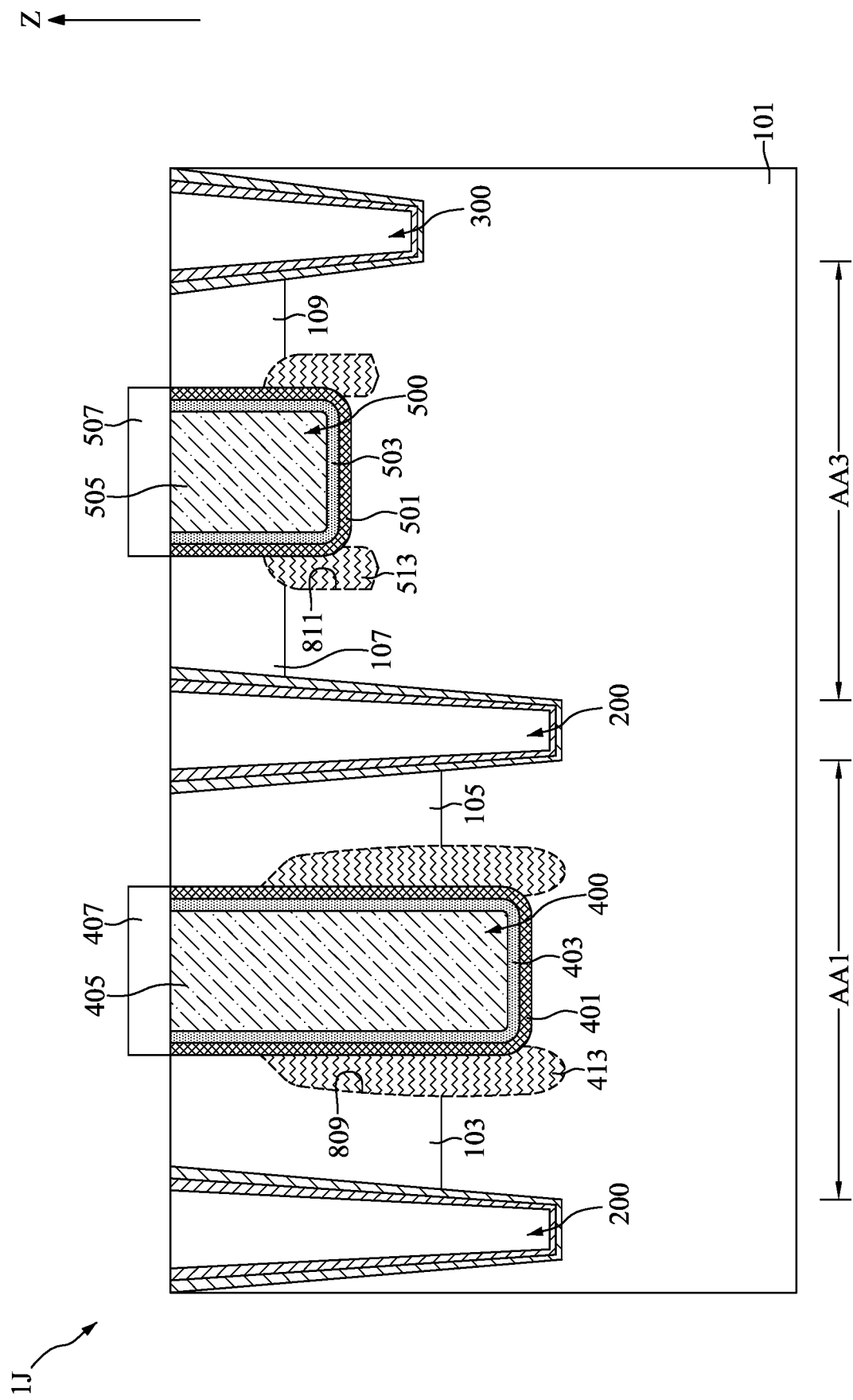

With reference to FIG. 28, the first gate structure 400, the second gate structure 500, the first capping layer 407, and the second capping layer 507 may be formed with a procedure similar to that illustrated in FIGS. 8 to 12. The first stress regions 413 and the second stress regions 513 may have lattice constant different from the lattice constant of the substrate 101. As a result, the carrier mobility of the semiconductor device 1J may be increased, and the performance of the semiconductor device 1J may be improved.

Figure 29:
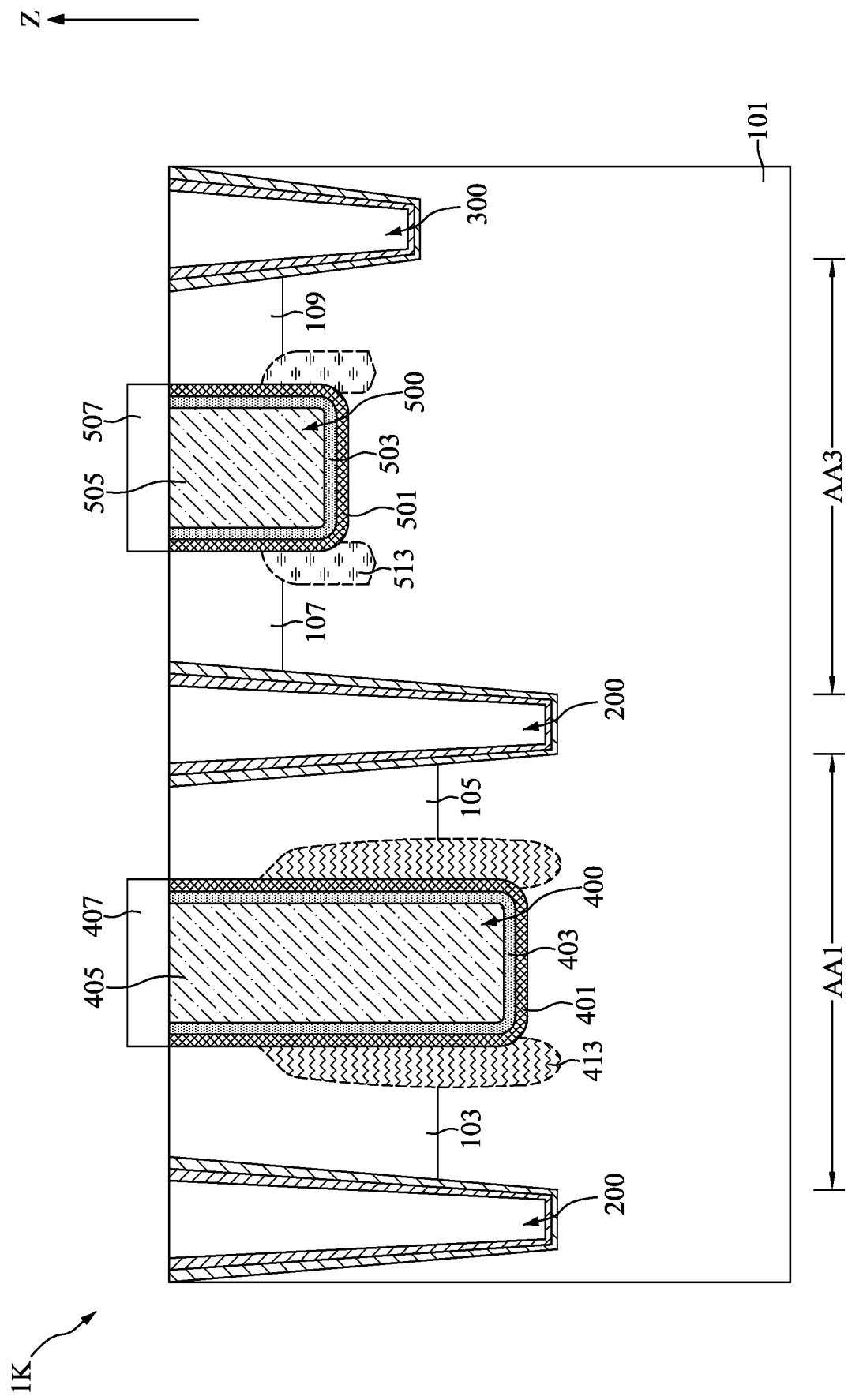
FIG. 29 illustrates, in a schematic top-view diagram, a semiconductor device in accordance with another embodiment of the present disclosure.

FIG. 29 illustrates, in a schematic top-view diagram, a semiconductor device 1K in accordance with another embodiment of the present disclosure.

With reference to FIG. 29, the semiconductor device 1K may have a structure similar to that illustrated in FIG. 28. The same or similar elements in FIG. 29 as in FIG. 28 have been marked with similar reference numbers and duplicative descriptions have been omitted. The first stress regions 413 and the second stress regions 513 may be formed separately and may have different lattice constants. For example, the first stress regions 413 may be formed of silicon carbide and may be tensilely strained and the second stress regions 513 may be formed of silicon germanium and may be compressively strained. The different strains of the first stress regions 413 and the second stress regions 513 may be suitable for different electrical type of devices.

One aspect of the present disclosure provides a semiconductor device including a substrate, a first gate structure positioned in the substrate and having a first depth and a first threshold voltage, and a second gate structure positioned in the substrate and having a second depth and a second threshold voltage. The first depth is greater than the second depth, and the first threshold voltage is different from the second threshold voltage.

Another aspect of the present disclosure provides a method for fabricating a semiconductor device including providing a substrate, forming a pre-trench in the substrate, concurrently deepening the pre-trench into a first trench and forming a second trench in the substrate, and concurrently forming a first gate structure in the first trench and a second gate structure in the second trench. The first gate structure has a first depth and a first threshold voltage, and the second gate structure has a second depth and a second threshold voltage. The first depth is greater than the second depth, and the first threshold voltage is different from the second threshold voltage.

Due to the design of the semiconductor device of the present disclosure, the first gate structure 400 and the second gate structure 500 may have different depths so as to have different threshold voltages. Therefore, the first gate structure 400 and the second gate structure 500 may provide different functions. As a result, the applicability of the semiconductor device 1A may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first gate structure positioned in the substrate and having a first depth and a first threshold voltage; and
a second gate structure positioned in the substrate and having a second depth and a second threshold voltage;
wherein the first depth is greater than the second depth, and the first threshold voltage is different from the second threshold voltage;
wherein the first gate structure comprises a first gate dielectric layer inwardly positioned in the substrate and having the first depth, a first gate electrode layer conformally positioned on the first gate dielectric layer, and a first gate filler layer positioned on the first gate electrode layer, and the second gate structure comprises a second gate dielectric layer inwardly positioned in the substrate and having the second depth, a second gate electrode layer conformally positioned on the second gate dielectric layer, and a second gate filler layer positioned on the second gate electrode layer.

2. The semiconductor device of claim 1, wherein the first gate dielectric layer has a same thickness as that of the second gate dielectric layer.

3. The semiconductor device of claim 2, wherein a top surface of first gate structure and a top surface of the second gate structure are substantially coplanar with a top surface of the substrate.

4. The semiconductor device of claim 3, further comprising a first capping layer positioned on the first gate filler layer and on the substrate.

5. The semiconductor device of claim 4, further comprising first isolation structures positioned in the substrate to define a first active area and a second isolation structure positioned opposite to one of the first isolation structures to define a second active area next to the first active area, wherein the first gate structure is positioned in the first active area and the second gate structure is positioned in the second active area.

6. The semiconductor device of claim 5, wherein the first isolation structures and the second isolation structure have different depths.

7. The semiconductor device of claim 6, further comprising a first wetting layer positioned between the first gate filler layer and the first gate electrode layer, wherein the first wetting is formed of titanium, tantalum, nickel, or cobalt.

8. The semiconductor device of claim 7, further comprising a first barrier layer positioned between the first wetting layer and the first gate filler layer, wherein the first barrier layer is formed of titanium nitride, tantalum nitride, or a combination thereof.

9. The semiconductor device of claim 6, wherein the first gate dielectric layer comprises a first bottom dielectric layer inwardly positioned in the substrate and a first top dielectric layer positioned between the first bottom dielectric layer and the first gate electrode layer, the first bottom dielectric layer is formed of high-k dielectric materials, and the first top dielectric layer is formed of silicon oxide.

10. The semiconductor device of claim 6, wherein bottom surfaces of the first impurity regions are at a same vertical level as bottom surfaces of the second impurity regions.

11. The semiconductor device of claim 6, wherein a vertical level of bottom surfaces of the first impurity regions is lower than a vertical level of bottom surfaces of the second impurity regions.

12. The semiconductor device of claim 5, wherein the first isolation structures have a same depth as that of the second isolation structure.

13. The semiconductor device of claim 2, wherein a top surface of first gate structure and a top surface of the second gate structure are at a vertical level lower than a vertical level of a top surface of the substrate, a first capping layer is positioned on the first gate structure, and a second capping layer is positioned on the second gate structure.

14. The semiconductor device of claim 13, wherein the first capping layer comprises a first bottom capping layer positioned on the first gate structure and a first top capping layer positioned on the first bottom capping layer, the first bottom capping layer is formed of high-k dielectric materials, and the first top capping layer is formed of silicon oxide.

15. The semiconductor device of claim 2, wherein top surfaces of the first gate electrode layer and a top surface of the first gate filler layer are at a vertical level lower than a vertical level of top surfaces of the first gate dielectric layer, and a first capping layer is positioned on the first gate electrode layer and the first gate filler layer and contacts an inner surface of the first gate dielectric layer.

16. The semiconductor device of claim 2, further comprising a first isolation structure and a second isolation structure positioned in the substrate to define a third active area, wherein the first gate structure and the second gate structure positioned in the third active area.

17. The semiconductor device of claim 16, further comprising third impurity regions positioned between the first isolation structure and the first gate structure, between the first gate structure and the second gate structure, and between the second gate structure and the second isolation structure.

18. A method for fabricating a semiconductor device, comprising:
providing a substrate;
forming a pre-trench in the substrate;
concurrently deepening the pre-trench into a first trench and forming a second trench in the substrate; and
concurrently forming a first gate structure in the first trench and a second gate structure in the second trench;
wherein the first gate structure has a first depth and a first threshold voltage, and the second gate structure has a second depth and a second threshold voltage;
wherein the first depth is greater than the second depth, and the first threshold voltage is different from the second threshold voltage;
wherein the step of concurrently forming the first gate structure in the first trench and the second gate structure in the second trench comprises:
conformally forming an insulation material layer in the first trench and the second trench, wherein the insulation material layer is formed of high-k dielectric materials;
conformally forming a work function material layer on the insulation material layer, wherein the work function material layer is formed of polycrystalline silicon, aluminum, copper, titanium, tantalum, tungsten, molybdenum, tantalum nitride, nickel silicide, cobalt silicide, titanium nitride, tungsten nitride, titanium aluminide, titanium aluminum nitride, tantalum carbon nitride, tantalum carbides, tantalum silicon nitride, metal alloys, or a combination thereof;
forming a filler material layer on the work function material layer and to fill the first trench and the second trench, wherein the filler material layer is formed of tungsten, aluminum, copper, titanium, silver, ruthenium, molybdenum, or alloys thereof; and
performing a planarization process until a top surface of the substrate is exposed to turn the insulation material layer into a first gate dielectric layer in the first trench and a second gate dielectric layer in the second trench, to turn the work function material layer into a first gate electrode layer in the first trench and a second gate electrode layer in the second trench, and to turn the filler material layer into a first gate filler layer in the first trench and a second gate filler layer in the second trench;
wherein the first gate dielectric layer, the first gate electrode layer, and the first gate filler layer together configure the first gate structure, and the second gate dielectric layer, the second gate electrode layer, and the second gate filler layer together configure the second gate structure.

* * * * *